United States Patent
Shim et al.

(10) Patent No.: US 9,755,631 B2
(45) Date of Patent: Sep. 5, 2017

(54) **APPARATUS AND METHOD FOR REDUCING *DI/DT* DURING POWER WAKE-UP**

(71) Applicant: Intel Corporation, Santa Clara, CA (US)

(72) Inventors: Yong Shim, West Lafayette, IN (US); Jaydeep P. Kulkarni, Portland, OR (US); Pascal A. Meinerzhagen, Hillsboro, OR (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/951,343

(22) Filed: Nov. 24, 2015

(65) Prior Publication Data

US 2017/0149427 A1   May 25, 2017

(51) Int. Cl.
| | | |
|---|---|---|
| *G05F 1/10* | (2006.01) | |
| *H03K 17/081* | (2006.01) | |
| *H03K 17/14* | (2006.01) | |
| *H03K 3/037* | (2006.01) | |

(52) U.S. Cl.
CPC ..... *H03K 17/08104* (2013.01); *H03K 3/0377* (2013.01); *H03K 17/145* (2013.01)

(58) Field of Classification Search
CPC ........... H03K 17/08104; H03K 3/0377; H03K 17/145
See application file for complete search history.

(56) References Cited

U.S. PATENT DOCUMENTS

| | | | | |
|---|---|---|---|---|
| 5,512,814 A | * | 4/1996 | Allman | G05F 3/262 323/267 |
| 5,739,681 A | * | 4/1998 | Allman | G05F 3/262 323/281 |
| 6,765,432 B2 | * | 7/2004 | Mitsui | G05F 3/242 327/112 |
| 7,411,423 B2 | * | 8/2008 | Berthold | H03K 19/0016 326/113 |
| 7,777,556 B2 | * | 8/2010 | Naitou | G06F 1/26 327/530 |
| 2006/0250159 A1 | | 11/2006 | Lin | |
| 2007/0103001 A1 | | 5/2007 | Chiozzi et al. | |

(Continued)

OTHER PUBLICATIONS

International Search Report & Written Opinion, mailed Jan. 5, 2017, for PCT Patent Application No. PCT/US2016/050807.

(Continued)

*Primary Examiner* — Kenneth B Wells
(74) *Attorney, Agent, or Firm* — Green, Howard & Mughal LLP

(57) ABSTRACT

Described is an apparatus which comprises: a power gate transistor coupled to an ungated power supply node and a gated power supply node, the power gate transistor having a gate terminal; a resistive device; a first transistor coupled in series with the resistive device together forming a pair, the first transistor also coupled to the gate terminal of the power gate transistor; a capacitive device coupled in parallel to the series coupled pair of the first transistor and resistive device; and a second transistor coupled to the gate terminal of the power gate transistor and the ungated power supply node.

20 Claims, 18 Drawing Sheets

(56) References Cited

U.S. PATENT DOCUMENTS

2013/0293282 A1    11/2013    Rotem et al.

OTHER PUBLICATIONS

Park, Shihong et al., "Flexible dv/dt and di/dt Control Method for Insulated Gate Power Switches", In: Industry Applications Conference, Thirty-Sixth IA S Annual Meeting. IEEE, Sep. 30-Oct. 4, 2001, pp. 1038-1045. <https://pdfs.semanticscholar.org/cde6/474399b5445b4f65cbaa00a0ad74fb5bceea.
Tronixstuff "Education—the RC circuit", Aug. 25, 2013 <http://tronixstuff.com/tag/capacitor>.

* cited by examiner

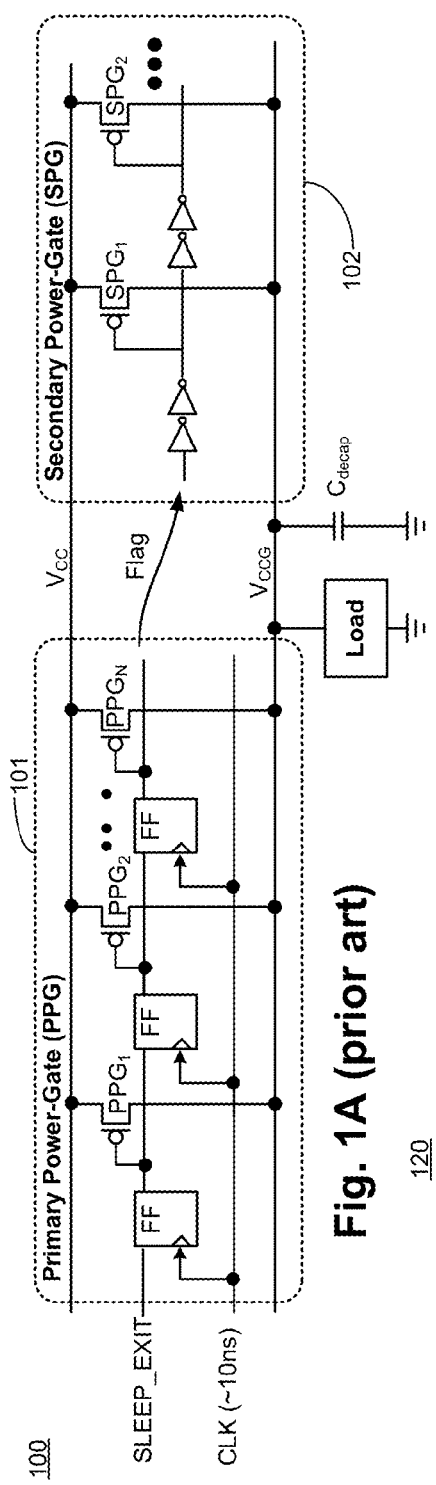
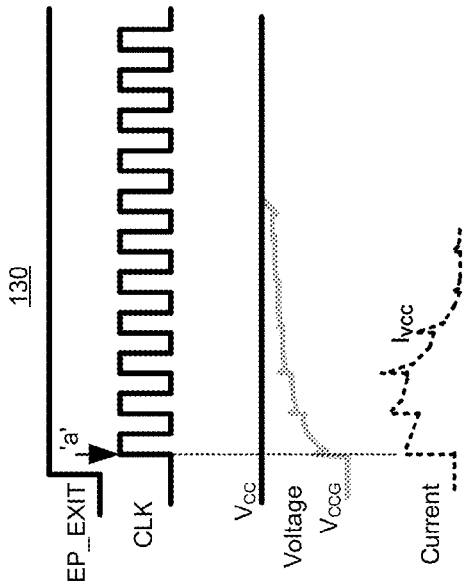
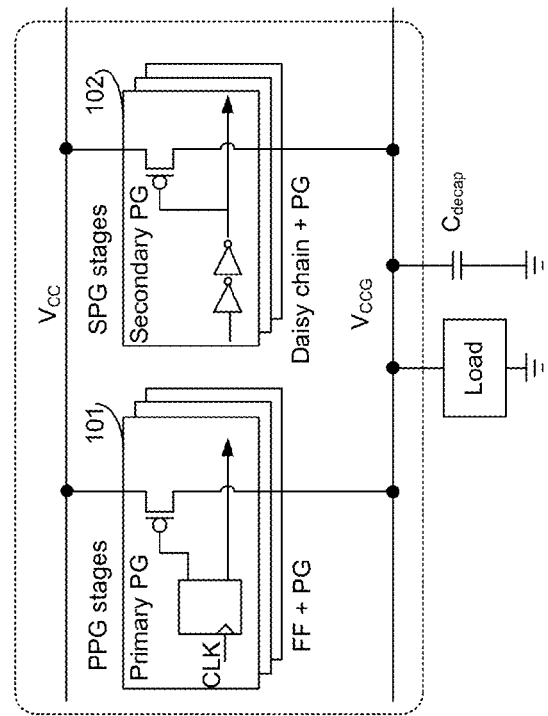
Fig. 1A (prior art)
Fig. 1B (prior art)
Fig. 1C (prior art)

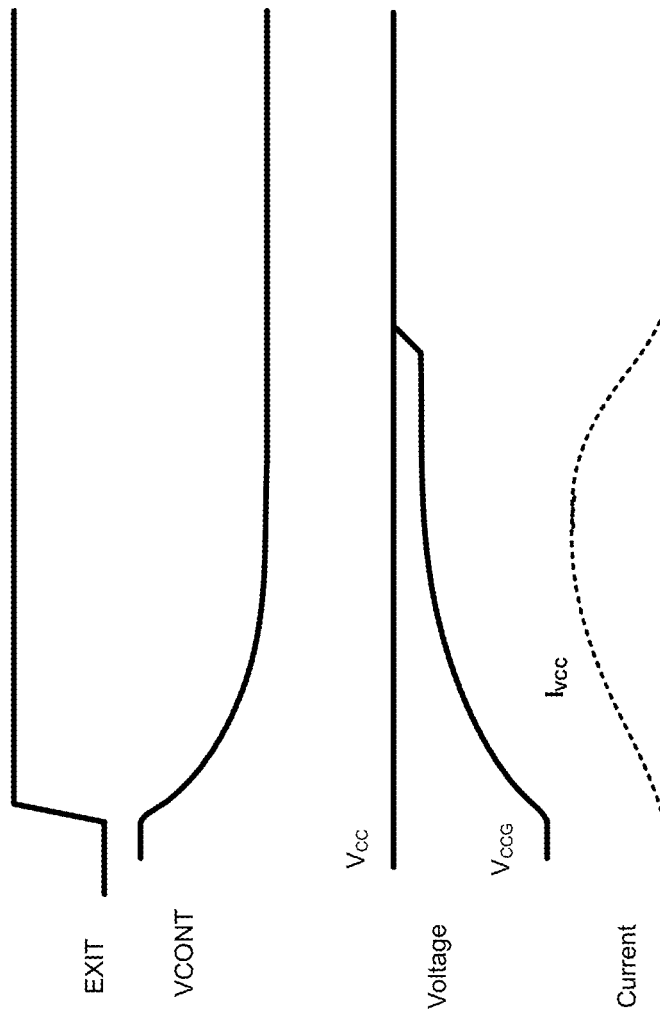

APPARATUS AND METHOD FOR REDUCING DI/DT DURING POWER WAKE-UP

BACKGROUND

As efficient power management for handheld devices (e.g., smart phones) becomes crucial, entering and/or exiting power-down mode(s) become quite frequent. While exiting a low power mode (e.g., sleep mode), sudden surge of current may occur on the power supply node. This sudden charge depends on the Process, Voltage, and Temperature (PVT) conditions and/or remaining charge inside the load unit coupled to the power supply node. This abrupt current change causes di/dt peak and may lead to functional failure in circuits coupled to the power supply node.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a baseline wake-up network with a two-stage configuration.

FIG. 1B illustrates a compact view of the baseline wake-up network with the two-stage configuration.

FIG. 1C illustrates a set of waveforms showing the operation of the baseline wake-up network of FIG. 1A.

FIG. 3A illustrates a set of waveforms showing the operation of the wake-up network of FIG. 2.

DETAILED DESCRIPTION

Figure 2:
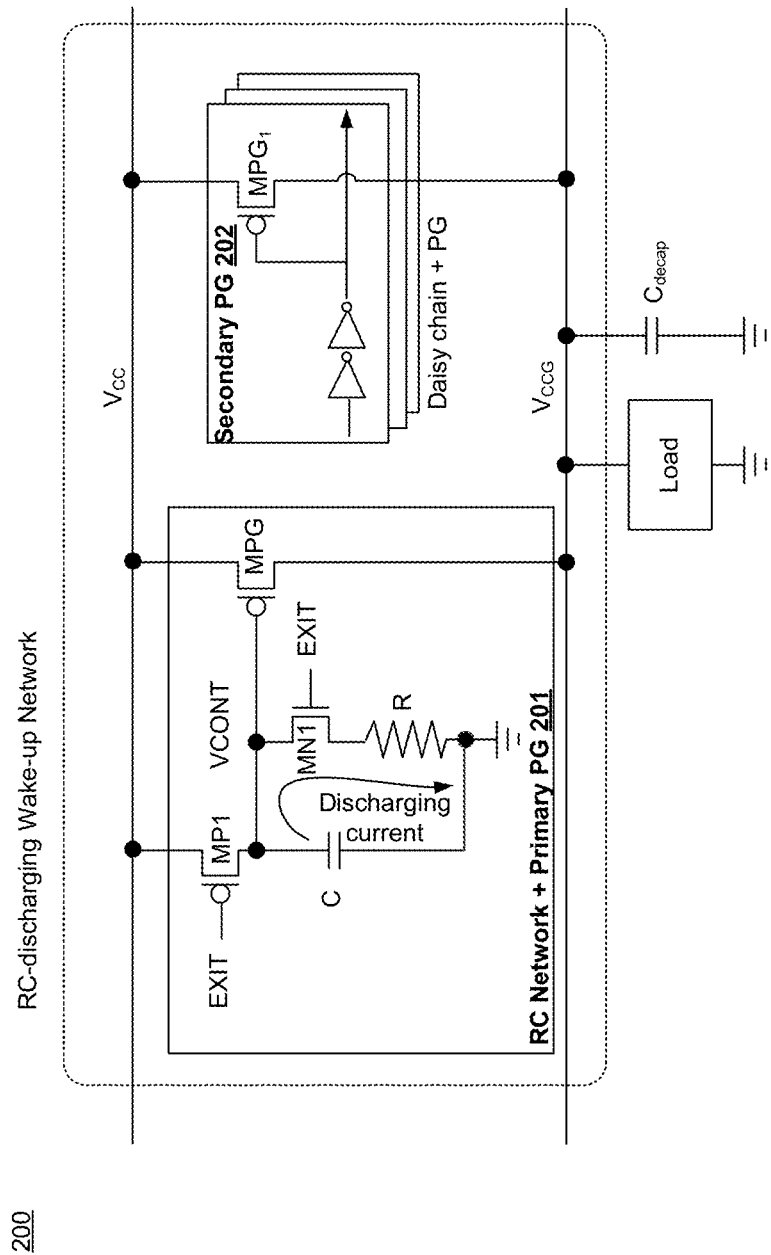
FIG. 2 illustrates a wake-up network with the two-stage configuration, in accordance with some embodiments of the disclosure.

One scheme to keep the di/dt level low enough to avoid functional failure on the circuits coupled to the power supply node is to use a two-stage wake-up network. In one such scheme, a series of flip-flops (FFs) are turned on based on a clock rising edge and then using a daisy chain to turn on the rest of the power gate transistors. However, this method needs additional external clock and circuitry to support it which usually requires a large sized hardware and high power budgets.

FIG. 1A shows the baseline wake-up network 100 with a two-stage configuration—first stage 101 and second stage 102. First stage 101 is flip-flop (FF) based wake-up configuration and second stage 102 is a daisy chain configuration. First stage 101 operates based on an external clock signal (CLK e.g., 10 ns). First stage 101 consists of primary power gates (PPG) PPG1-N with their gate terminals connected to the outputs of the respective FFs, where 'N' is a number greater than three. The PPG1-N are coupled to an ungated power supply node VCC and a gated power supply node VCCG. A load and a decoupling capacitor Cdecap are coupled to the VCCG node. Throughout the disclosure, labels for nodes and corresponding signals on that node are interchangeably used. For example, VCC may refer to node VCC or power supply VCC depending on the context of the sentence.

A "SLEEP_EXIT" signal is received as data input to the first FF. The output of the first FF is provided as input to the subsequent FF, and so on. Here, "SLEEP_EXIT" refers to a signal that when logically low, indicates an exit from a low power state such as a sleep state. Conversely, when the SLEEP_EXIT signal is logically high, it indicates entering the low power state.

After the SLEEP_EXIT signal de-asserts (i.e., transitions from logic high to logic low in this example), each single Primary Power-Gate (PPG) element (i.e., PPG1-N) is turned on in series synchronized with the rising edge of CLK. When all the PPG transistors in PPG stage 101 (also referred to as the first stage) are turned on, first stage 101 ends its operation and hands over the Flag signal to the Secondary Power-Gate (SPG) stage 102 (same as the second stage).

Here, SPG stage 102 is a simple daisy chain (e.g., approximately with 1200 stages) with a small power-gate transistor per stage. Each PG transistor in SPG stage 102 is turned on every two inverter gate delays to decrease the current peak on the $V_{CC}$ and $V_{CCG}$ nodes. One intention of using this kind of two-step wake-up network is to obtain a low di/dt peak within a reasonable wake-up time. However, this scheme results in significant di/dt which is not low enough to not create problems for circuits operating on $V_{CC}$ (Note: when $V_{CCG}$ is rising, no active operation is happening at this time. It is the di/dt on $V_{CC}$ node which affects the neighboring active work.).

FIG. 1B illustrates a compact view 120 of the baseline wake-up network with the two-stage configuration. It is pointed out that those elements of FIG. 1B having the same reference numbers (or names) as the elements of any other figure can operate or function in any manner similar to that described. Here, few stages of the PPG stages 101, and large number (e.g., 1278) of SPG stages 102 are shown. The number of SPG stages 102 can change based on the loading conditions. The PPG stages 101 may be connected in a serial fashion and the SPG stages 102 may be connected in a daisy chain fashion.

FIG. 1C illustrates set 130 of waveforms showing the operation of the baseline wake-up network of FIG. 1A. It is pointed out that those elements of FIG. 1C having the same reference numbers (or names) as the elements of any other figure can operate or function in any manner similar to that described.

FIG. 1C shows the conceptual waveform of conventional two step wake-up method and the expected di/dt plot. When a first PG transistor $PPG_1$ is turned on at timing 'a', $V_{CCG}$ power rail will start charging up. Since $V_{CCG}$ initially has very low potential level, the transistor $PG_1$ can have a maximum $V_{DS}$ value. So $PPG_1$ provides a huge current to the $V_{CCG}$ rail (or node). This is why there is a sudden jump in current and voltage at timing 'a'.

After that, slow rising of the voltage is followed. When the next clock rising edge comes, the same current and voltage jump occurs but with a reduced step as the VDS of the next transistor is decreased. The current peaks at every clock rising edge causes large current variation during a short time period. Even though the total current required to fully charge the VCCG rail can be distributed over a wide time range by using this conventional two-step wake-up network, the current surge from the each PPG transistor turn-on event can cause an unexpected local di/dt problem.

Various embodiments describe an apparatus to control the Primary Power-Gate (PPG) using an RC discharging path to reduce a di/dt peak during a wake-up event. The apparatus of some embodiments can be utilized with any applications that support sleep enter/exit modes. In some embodiments, a low di/dt profile can be obtained by adopting RC discharging path to control the degree of turn-on of a PPG transistor. In some embodiments, the PPG unit can form a PPG chain and this can lower the di/dt peak even more.

In some embodiments, a self-gating feature can be employed with an additional inverter which generates an enable signal for the next unit from the RC discharging voltage. In some embodiments, by using a number of gates to detect a slope of the RC discharging path, PVT tracking option can be realized. The additional circuitry converts the duration of decaying signal into a pulse and uses pulse to control the discharging speed by controlling the value of a resistance (and/or capacitance), in accordance with some embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/-10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices.

MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 2 illustrates wake-up network 200 with a two-stage configuration, in accordance with some embodiments of the disclosure. It is pointed out that those elements of FIG. 2 having the same reference numbers (or names) as the elements of any other figure can operate or function in any manner similar to that described.

In some embodiments, wake-up network 200 comprises an RC (resistor-capacitor) network with a primary power gate (PPG) stage 201 and a SPG stage 202. In some embodiments, SPG stage 202 is similar to the SPG stage 102 of FIG. 1A. Referring back to FIG. 2, in some embodiments, PPG stage 201 comprises a p-type power gate transistor PPG, an n-type transistor MN1, a p-type transistor MP1, a resistive device with resistance 'R' (referred to here as resistor 'R'), and a capacitive device with capacitance 'C' (referred to here as capacitor 'C'). While the various embodiments are described with reference to p-type transistors for the power gates for the PPG stage and SSG stage, the embodiments can be modified within the scope of the invention to have n-type transistors or a combination of p-type and n-type transistors for the power gates for the PPG stage and SPG stage.

In some embodiments, PPG stage 201 and SPG stage 202 electrically couple the ungated power supply node $V_{CC}$ to the gated power supply node $V_{CCG}$ according to the logic condition of the EXIT signal. In some embodiments, a LOAD (e.g., processor core, memory, or another other logic section, or integrated circuit) is coupled to the $V_{CCG}$ node. In some embodiments, a decoupling capacitor $C_{decap}$ is coupled to the $V_{CCG}$ node and ground.

In some embodiments, transistor MPG (e.g., $MPG_1$ of $MPG_{1-N}$) has a source terminal coupled to $V_{CC}$ and a drain terminal coupled to $V_{CCG}$. In some embodiments, the gate terminal of transistor MPG (i.e., charging node VCONT) is coupled to the drain terminal of transistor MN1 and the drain terminal of transistor MP1. In some embodiments, the gate terminals of transistor MN1 and transistor MP1 are controlled by the EXIT signal (e.g., SLEEP_EXIT).

In some embodiments, capacitor 'C' is coupled to the source terminal of transistor MP1 and ground. In some embodiments, resistor 'R' is coupled to the source terminal of transistor MN1 and ground. The resistor 'R' and capacitor 'C' together form a pair which can be replaced with a transistor based 'R' and 'C', in accordance with some embodiments. For example, a MOS transistor configured in a linear region can behave as resistor 'R' while a MOS transistor configured in accumulation or depletion mode can behave as capacitor 'C'. In some embodiments, the capacitor 'C' is a metal capacitor. In some embodiments, the capacitor 'C' is a hybrid of a metal capacitor and a transistor capacitor.

Compared to FIG. 1B, wake-up network 200 has a single PPG stage instead of multiple chain stages, in accordance with some embodiments. In some embodiments, this single stage uses an RC discharging path to control the degree of turn-on of the primary PG transistor MPG.

During SLEEP mode, the EXIT signal is logically low and the transistor MN1 is off which allows the charging node VCONT to charge to a high potential via capacitance stored in capacitor 'C'. When the SLEEP mode is being exited, the EXIT signal is high which creates a path from the charging node VCONT to ground through resistor R. As such, the transistor MN1, when turned on, discharges the capacitor 'C' and this process slowly turns on the power gate MPG. In some embodiments, when the power gate transistor MPG is very large (e.g., large W/L, where 'W' is the width and 'L' is the length), capacitor 'C' can be removed and the gate capacitance of the power gate transistor MPG functions as capacitor 'C'. The turn on timing of the power gate transistor MPG is controlled by the RC time constant, which in turn depends on the capacitance 'C' and resistance 'R' values. The slow turn on behavior of the MPG transistor results in low di/dt on node $V_{CCG}$ because the sudden inrush of current from $V_{CC}$ to $V_{CCG}$ is reduced.

In some embodiments, when transistor MPG of PPG stage 201 is fully turned on, SPG stage 202 turns on in a daisy chain fashion. For example, transistors $MPG_1$ of SPG stage 202 turn on one at a time for all stages of SPG stage 202. In some embodiments, when transistor MPG of PPG stage 201 is partially turned on, transistors $MPG_1$ of SPG stage 202 begin to turn on one at a time for all stages of SPG stage 202.

FIG. 3A illustrates set 300 of waveforms showing the operation of the wake-up network of FIG. 2, in accordance with some embodiments. It is pointed out that those elements of FIG. 3A having the same reference numbers (or names) as the elements of any other figure can operate or function in any manner similar to that described, but are not limited to such.

Initially, the voltage potential of the VCONT node is $V_{CC}$ since the transistor MP1 is turned on. When the EXIT signal transitions to a high level, then the transistor MN1 turns on and the transistor MP1 turns off. The charge inside the capacitor 'C' will then discharge through the series path of the transistor MN1 and resistor 'R', in accordance with some embodiments. So, the decaying time is determined by the RC time constant and the curvature of the decaying slope follows the negative exponential shape. In some embodiments, by connecting this voltage directly to the gate of transistor MPG, the transistor MPG can slowly turn on. Eventually, a very smooth rising and falling curve on the both $V_{CCG}$ and $I_{VCC}$ can be obtained, in accordance with some embodiments.

Compared to the conventional FF based wake-up network 100 of FIG. 1A where several peaks are shown on the current curve (e.g., see FIG. 1C), wake-up network 200 shows an RC discharging control voltage with a smooth curve over the entire operation range. As such, sudden changes in the current profile are substantially alleviated by the RC network based PPG, according to some embodiments.

Figure 3B:
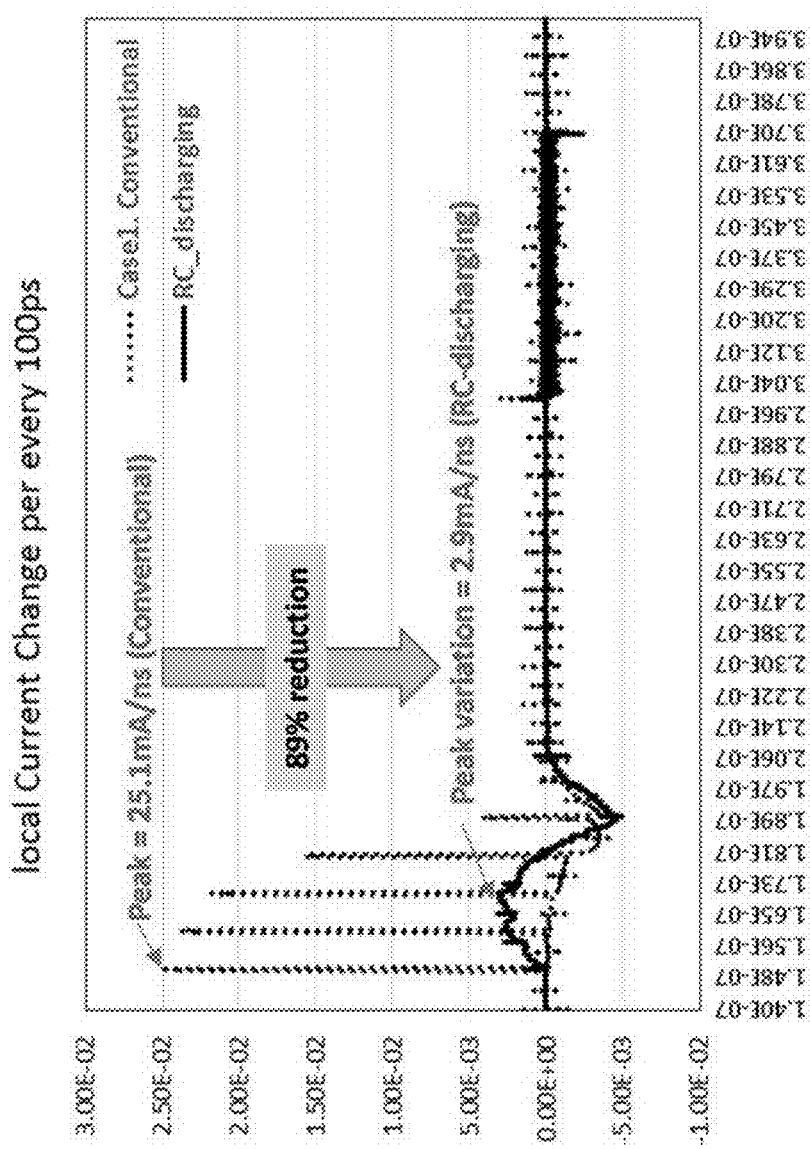
FIG. 3B illustrates a plot showing a current variation comparison on the $I_{VCC}$ rail per every 100 ps for the baseline wake-up network of FIG. 1A and the wake-up network of FIG. 2, in accordance with some embodiments.

FIG. 3B illustrates a plot 320 showing a current variation comparison on the $I_{VCC}$ rail per every 100 ps for baseline wake-up network of FIG. 1A and wake-up network of FIG. 2, in accordance with some embodiments. It is pointed out that those elements of FIG. 3B having the same reference numbers (or names) as the elements of any other figure can operate or function in any manner similar to that described, but are not limited to such.

Plot 320 shows the current peak reduction by using the RC discharging based PPG control of FIG. 2. With the conventional FF based scheme, as shown in FIG. 1A, high current peaks occur every 10 ns which is the period of the clock, and the maximum peak reaches 25.1 mA/ns. In the case of the scheme shown in FIG. 2, in some embodiments, the maximum current delta is 2.9 mA/ns which is 89% lower value compared to the FF based approach of FIG. 1A.

Figure 4B:
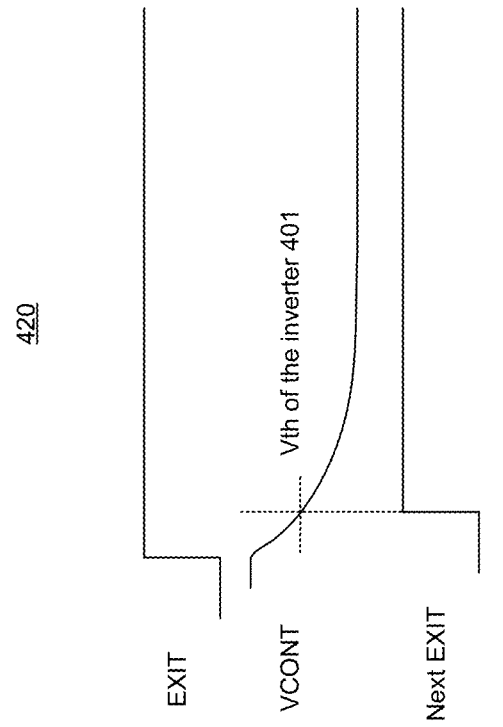
FIG. 4B illustrates a plot showing the operation of the wake-up apparatus of FIG. 4A, in accordance with some embodiments of the disclosure.
Figure 4A:
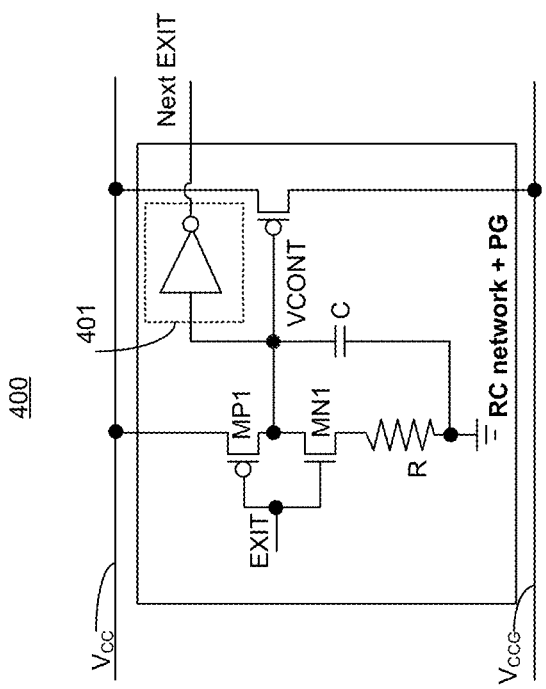
FIG. 4A illustrates an RC (Resistance-Capacitance) discharging wake-up apparatus with a driver to drive another wake-up apparatus, in accordance with some embodiments of the disclosure.

FIG. 4A illustrates an RC discharging wake-up apparatus 400 with a driver to drive another wake-up apparatus, in accordance with some embodiments of the disclosure. It is pointed out that those elements of FIG. 4A having the same reference numbers (or names) as the elements of any other figure can operate or function in any manner similar to that described, but are not limited to such.

So as not to obscure the embodiments, differences between wake-up apparatus 400 and PPG stage 201 are described. Wake-up network 200 describes a single PPG stage 201. In cases where it is challenging to design a single PPG stage 201 (e.g., due to layout constraints), a modular based chain configuration is provided in accordance with some embodiments. Wake-up apparatus 400 is one such embodiment of a modular unit that can be coupled together with other modular apparatuses to form a chain configuration.

In some embodiments, wake-up apparatus 400, which forms a PPG stage, includes an inverter 401 to enable a next wake-up apparatus 400. In some embodiments, the input of inverter 401 is coupled to the charging node VCONT. In some embodiments, the output of inverter 401 provides an enable signal for the next wake-up apparatus 400. This enable signal (Next EXIT) couples to the next EXIT node of the next wake-up apparatus 400.

FIG. 4B illustrates set 420 of waveforms showing the operation of the wake-up apparatus of FIG. 4A, in accordance with some embodiments of the disclosure. It is pointed out that those elements of FIG. 4B having the same reference numbers (or names) as the elements of any other figure can operate or function in any manner similar to that described, but are not limited to such.

When the EXIT signal asserts, indicating an end of a low power state (e.g., a sleep state), the VCONT signal exponentially decays with a decaying slope controlled by the RC time constant partially established by the capacitor 'C' and resistor 'R' pair. When the VCONT signal decays below the switching threshold of inverter 401, inverter 401 outputs the Next EXIT signal. As such, the Next EXIT signal is self-generating.

Figure 4C:
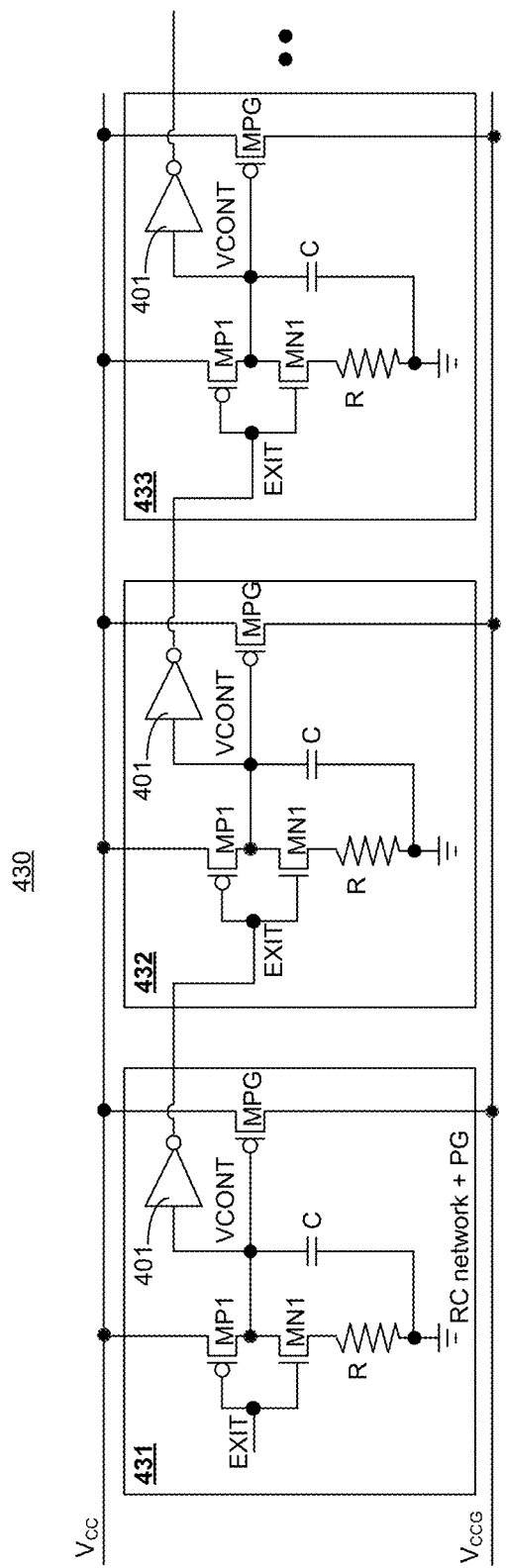
FIG. 4C illustrates a chain of wake-up apparatuses of FIG. 4A, in accordance with some embodiments of the disclosure.

FIG. 4C illustrates chain 430 of wake-up apparatuses of FIG. 4A, in accordance with some embodiments of the disclosure. It is pointed out that those elements of FIG. 4B having the same reference numbers (or names) as the elements of any other figure can operate or function in any manner similar to that described, but are not limited to such.

In some embodiments, the next EXIT signal is used for controlling the gate terminal of transistor MN1 of the next wake-up apparatus. Chain 430 shows a serial link of wake-up apparatuses 431, 432, 433, and so on, where each wake-up apparatus is wake-up apparatus 400, in accordance with some embodiments. In some embodiments, each wake-up apparatus begins to charge the $V_{CCG}$ node after the charge on the VCONT node of that apparatus decays below a threshold voltage of the inverter of that wake-up apparatus.

In some embodiments, to form chain 430, a single PPG unit 201 is divided into smaller units (e.g., 20 small units represented as stages 431, 432, 433, etc.) with internal components downsized by a particular ratio (e.g., 20), and with the addition of inverter 401. In some embodiments, the capacitance value 'C' for each smaller unit (e.g., represented as stages 431, 432, 433, etc.) may be too small when all internal components of the stage are downsized, and this may lead to too fast wake-up time. In some embodiments, for the proper discharging speed, the resistance value 'R' for each PPG stage may be modified to compensate for smaller sized capacitance value 'C'. As such, the RC time constant is controlled, in accordance with some embodiments.

Figure 4D:
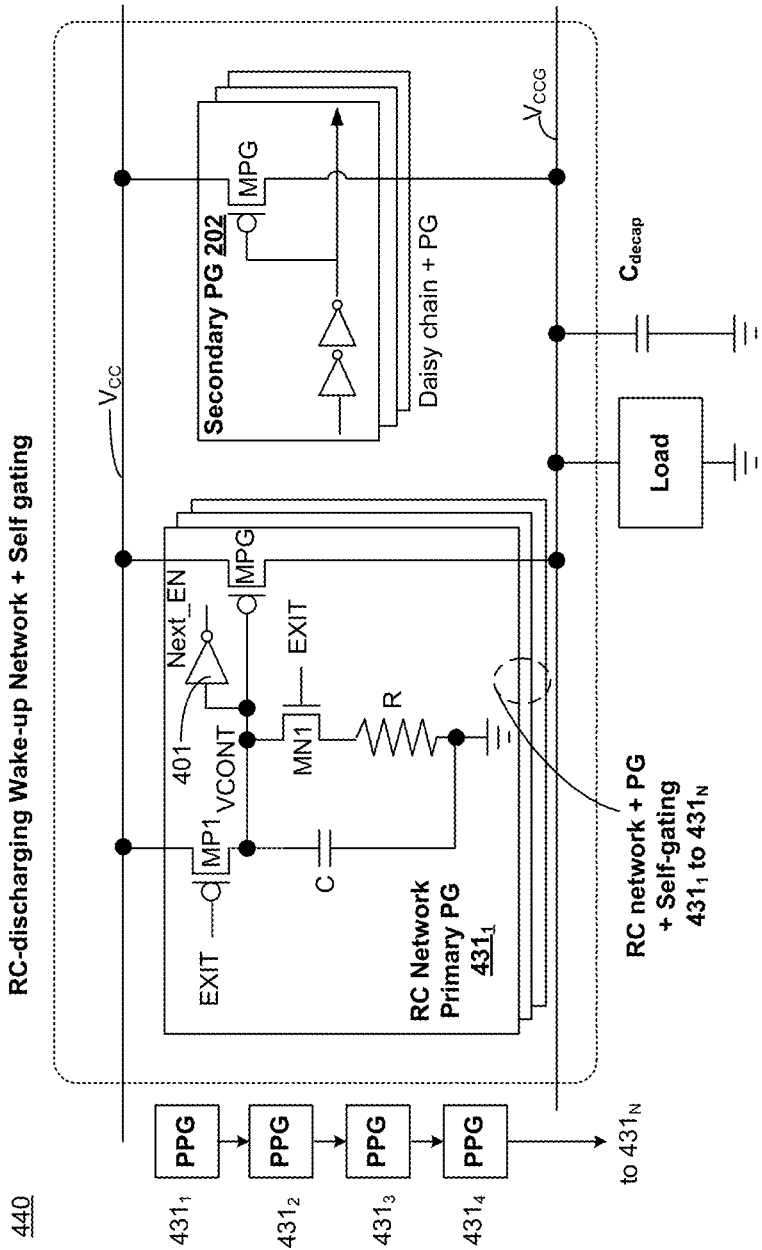
FIG. 4D illustrates a self-gating wake-up network, in accordance with some embodiments of the disclosure.

FIG. 4D illustrates a self-gating wake-up network 440, in accordance with some embodiments of the disclosure. It is pointed out that those elements of FIG. 4D having the same reference numbers (or names) as the elements of any other figure can operate or function in any manner similar to that described, but are not limited to such.

In some embodiments, self-gating wake-up network 440 comprises an RC network based PPGs stages $431_1$-$431_N$, where 'N' is an integer greater than one, and SPG stages 202. Here, each PPG stage of stages $431_{1-N}$ is the same as PPG stage 431 of FIG. 4C. In some embodiments, self-gating wake-up network 440 is configured such that each PPG stage serially drives the next PPG stage. Such a chained configuration causes the voltage on the $V_{CCG}$ node to ramp up in substantially regular intervals with regular ramps, in accordance with some embodiments.

Figure 4E:
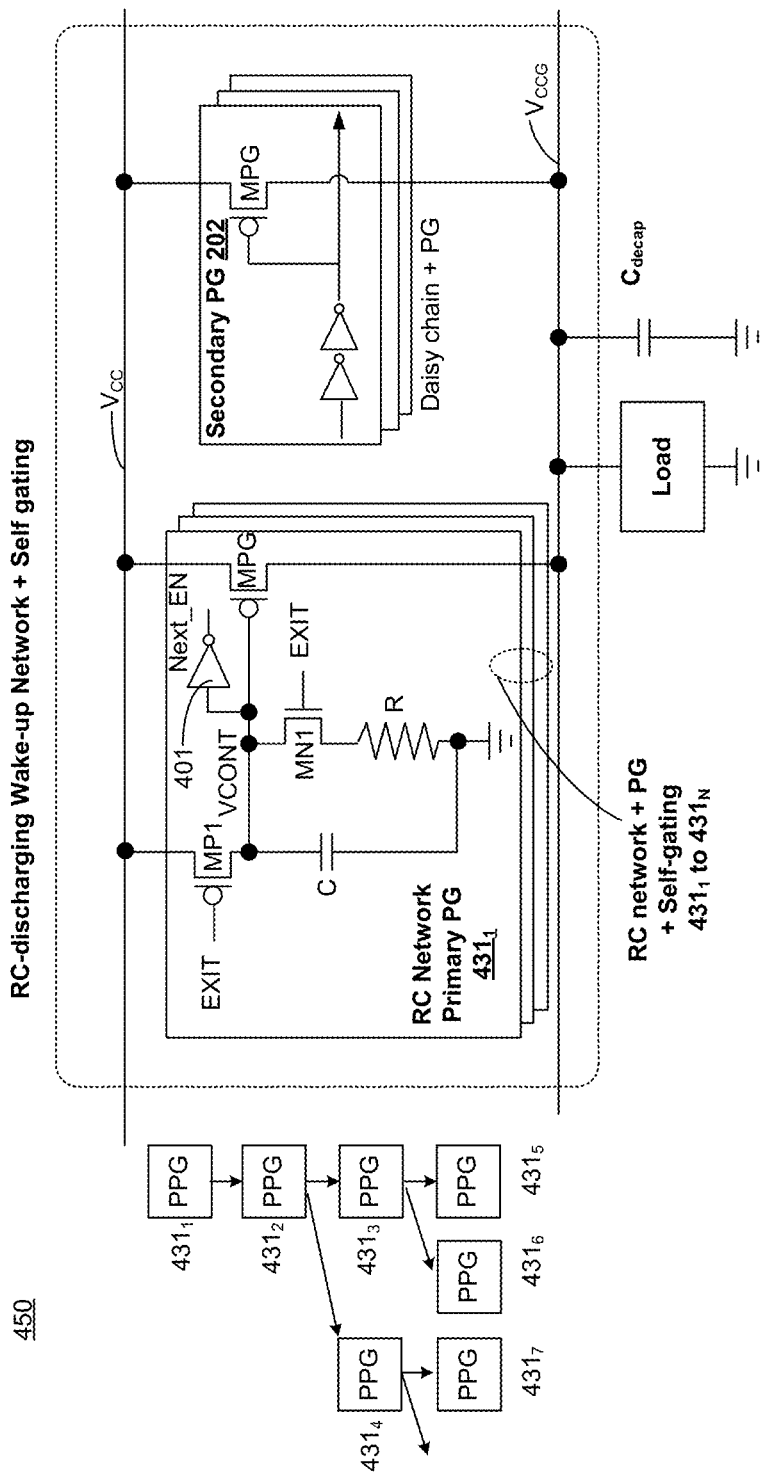
FIG. 4E illustrates a self-gating wake-up network, in accordance with some embodiments of the disclosure.

FIG. 4E illustrates self-gating wake-up network 450, in accordance with some embodiments of the disclosure. It is pointed out that those elements of FIG. 4E having the same reference numbers (or names) as the elements of any other figure can operate or function in any manner similar to that described, but are not limited to such.

Compared to the embodiment 440 shown in FIG. 4D, here the PPG stages are coupled together in a tree like fashion (as shown at the left side of FIG. 4E). For example, PPG stage $431_1$ drives PPG stage $431_2$, PPG stage $431_2$ drives PPG stages $431_3$ and $431_4$. PPG stage $431_3$ drives PPG stages $431_5$ and $431_6$, PPG stage $431_4$ drives PPG stages $431_7$ and $431_8$ (not shown), and so on. In some embodiments, a tree configuration reduces the $V_{CCG}$ wake-up time when di/dt is not significant at slow process corner condition. The embodiments are not limited to a tree configuration. In some embodiments, any serial/tree/parallel combination of PPG enable can be realized without exceeding a target di/dt peak.

Figure 4F:
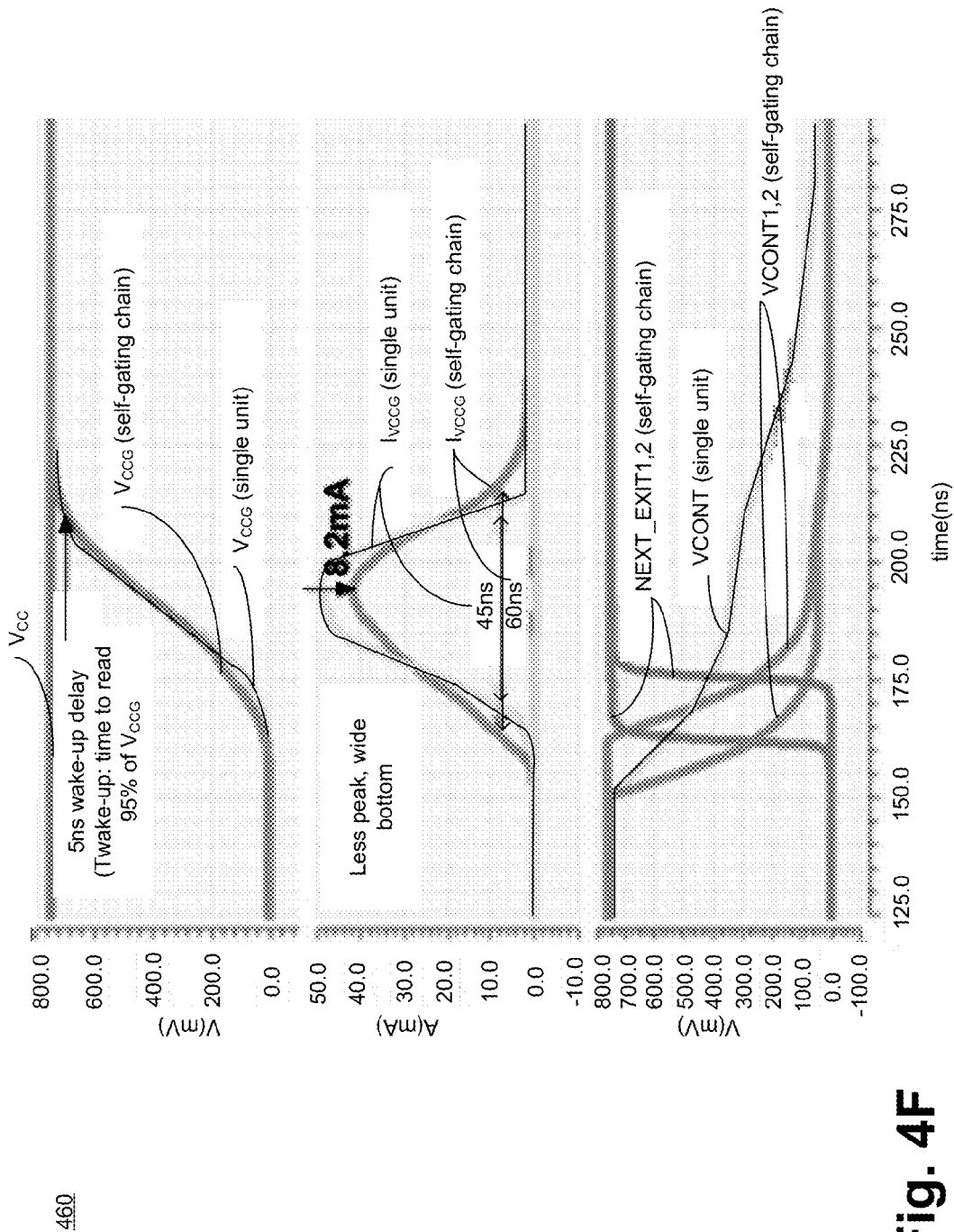
FIG. 4F illustrates a plot showing simulation results of the RC discharging wake-up apparatus of FIG. 4A, in accordance with some embodiments of the disclosure.

FIG. 4F illustrates set 460 of plots showing simulation results of the RC discharging wake-up apparatus of FIG. 4A, in accordance with some embodiments of the disclosure. It is pointed out that those elements of FIG. 4F having the same reference numbers (or names) as the elements of any other figure can operate or function in any manner similar to that described, but are not limited to such.

The plot on the top in set 460 illustrates the wake-up delay times for a self-gating chain (e.g., 430 shown in FIG. 4C) and single PPG stage 201, where the wake-up delay time is measured as the time it takes the $V_{CCG}$ power supply to reach 95% of its high level (which is close to or at $V_{CC}$). The top plot in set 460 also shows the voltage levels of $V_{CC}$ and $V_{CCG}$ over time. The top plot in set 460 shows that the self-gating chain (e.g., 430 shown in FIG. 4C) results in longer wake-up delay time compared to the single PPG stage 201, and as such the self-gating chain is expected to have lower di/dt effects on the $V_{CCG}$ node, in accordance with some embodiments.

The plot in the middle in set 460 shows the current peak for a self-gating chain (e.g., 430) and single PPG stage 201. The middle plot shows a reduction in peak current with self-gating chain (e.g., 430) compared to the single PPG stage 201. The middle plot also shows a wider bottom for the self-gating chain (e.g., 430) compared to the single PPG stage 201. The area under the two curves is substantially the same, in accordance with some embodiments. In this example, an 8.2 mA reduction in peak current is seen with self-gating chain (e.g., 430 shown in FIG. 4C) compared to the single PPG stage 201, and 15 ns wider bottom (i.e., 60 ns-45 ns) for self-gating chain (e.g., 430 shown in FIG. 4C) is observed compared to the single PPG stage 201.

The bottom plot in set 460 shows the charging behavior of the charging node VCONT for a self-gating chain (e.g., 430 shown in FIG. 4C) and the single PPG stage 201. Because of smaller capacitance values, the VCONT node for each PPG stage of the self-gating chain (e.g., 430 shown in FIG. 4C) charges faster compared to the charging of the VCONT node of PPG stage 201, in accordance with some embodiments.

Figure 5A:
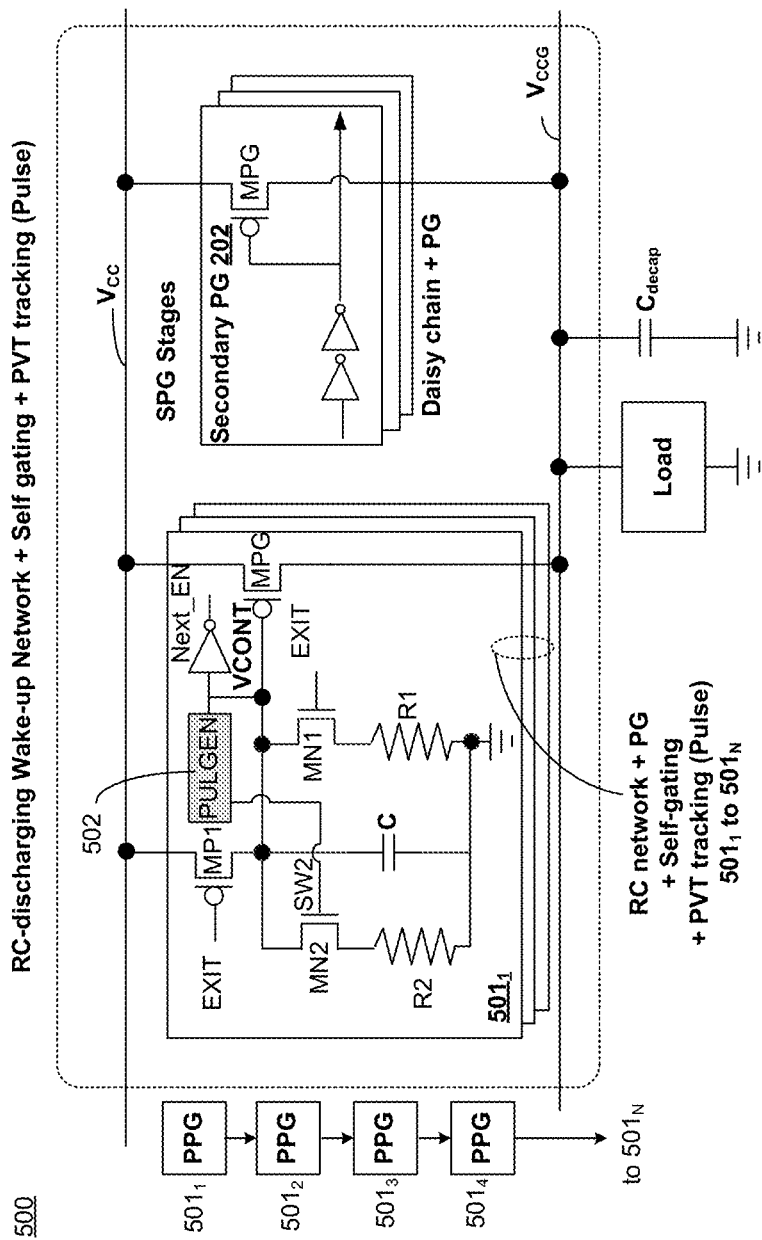
FIG. 5A illustrates an RC discharging wake-up network with self-gating and process, voltage, and temperature (PVT) tracking using a pulse generator, in accordance with some embodiments of the disclosure.

FIG. 5A illustrates an RC discharging wake-up network 500 with self-gating and PVT tracking using a pulse generator, in accordance with some embodiments of the disclosure. It is pointed out that those elements of FIG. 5A having the same reference numbers (or names) as the elements of any other figure can operate or function in any manner similar to that described, but are not limited to such.

The RC time constant which may be largely affected by the PVT conditions and self-gating scheme of FIG. 4A can result in too slow discharging speed in slow process technology corners and low $V_{CC}$ power supply conditions, and vice versa. To address this problem, PVT insensitive modular based PPG chain network 500 is used in accordance with some embodiments. In some embodiments, RC discharging wake-up network 500 comprises one or more PPG stages with PVT tracking using a pulse generator, and SPG stage 202. In this example, 'N' PPG stages 501$_1$-501$_N$ are shown, where 'N' is an integer greater than one. So as not to obscure the various embodiments, PPG stage 501$_1$ is described. The same description applies to other PPG stages.

In some embodiments, PPG stage 501$_1$ comprises pulse generator (PULGEN) 502, second n-type transistor MN2, and second resistive device with resistance R2. Here, the first resistive device with resistance 'R' is relabeled as "R2" (also referred to as resistor "R2"). In some embodiments, the input of pulse generator 502 is coupled to the charging node VCONT. In some embodiments, the output of pulse generator 502 is node SW2 which is coupled to the gate terminal of transistor MN2. In some embodiments, the drain terminal of transistor MN2 is coupled to the charging node VCONT, while the source terminal of the charging node VCONT is coupled to one end of the resistor "R2". The other end of resistor "R2" is coupled to ground, in accordance with some embodiments.

As such, the series combination of transistor MN2 and resistor R2 is in parallel to the series combination of transistor MN1 and resistor R1. In some embodiments, the resistance of resistor R2 is the same as resistance of resistor R1. In some embodiments, the resistance of resistor R2 is different than the resistance of resistor R1. For example, the resistance of resistor R2 is smaller than the resistance of resistor R1. Other components of PPG stage 501$_1$ are the same as those described for PPG stage 400, in accordance with some embodiments.

In some embodiments, each PPG stage is coupled together in a chain such that the NEXT_EN signal (same as the Next Exit signal) generated from inverter 401 of that PPG stage is received as input at the gate of transistor MN1 of the next PPG stage. (Note, in some embodiments, each stage has an inverter 401. So, inverter 401 of PPG stage 431$_1$ is inverter 401$_1$, inverter 401 of PPG stage 431$_2$ is inverter 401$_2$, and so on.) As such, a serial chain is formed as shown on the left side of FIG. 5A, in accordance with some embodiments.

In some embodiments, pulse generator 502 is intended to detect a slope of the decaying signal on the VCONT charging node. In some embodiments, pulse generator 502 generates a pulse having a width which is a function of the PVT condition of the charging node VCONT. This pulse is provided on the node SW2, and this pulse causes transistor MN2 to turn on, in accordance with some embodiments. In some embodiments, the transistor MN2 provides an additional temporary discharging path to speed the discharging speed to mitigate the PVT effects.

For example, in a slow process corner with low $V_{CC}$ power supply levels, the charge on the VCONT node will discharge slowly compared to a fast process corner. A very low discharging of the charge on the VCONT node may slow down the wake-up time to an unsatisfactory level (e.g., too slow to meet a wake-up specification). In some embodiments, pulse generator 502 generates a pulse which turns on transistor MN2 to speed up the discharging of the VCONT node to improve the wake-up time but still keep the di/dt on VCONT node low.

Figure 5B:
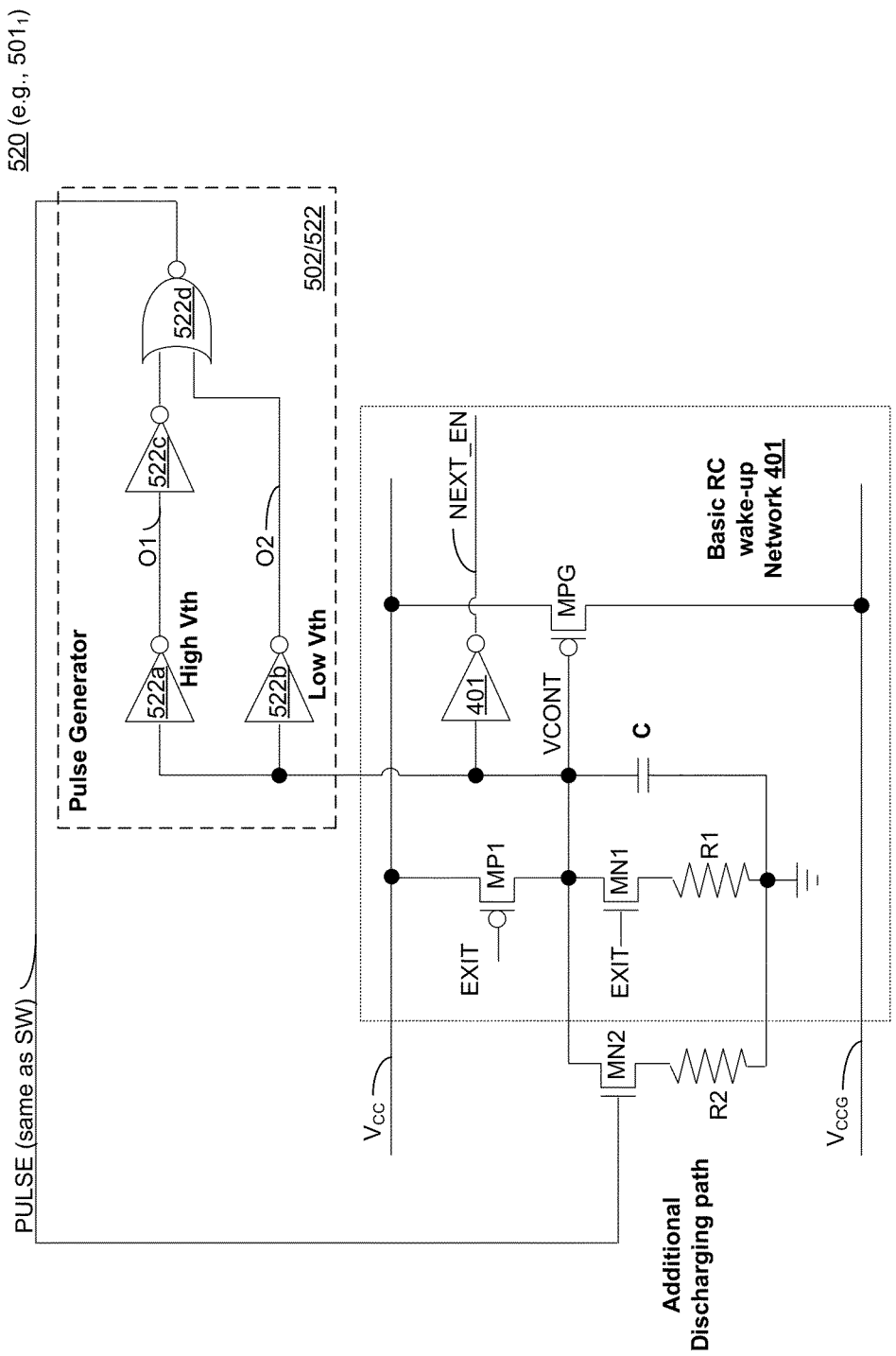
FIG. 5B illustrates a circuit level implementation of the RC discharging wake-up network with self-gating and PVT tracking using a pulse generator, in accordance with some embodiments of the disclosure.

FIG. 5B illustrates a circuit level implementation 520 of the RC discharging wake-up network with self-gating and PVT tracking using a pulse generator, in accordance with some embodiments of the disclosure. It is pointed out that those elements of FIG. 5B having the same reference numbers (or names) as the elements of any other figure can operate or function in any manner similar to that described, but are not limited to such.

In some embodiments, pulse generator 502/522 is implemented using dual threshold inverters as shown in implementation 522 (also referred to as pulse generator 522). In some embodiments, pulse generator 522 comprises first inverter 522$a$ formed of high threshold (i.e., high Vt) devices, second inverter 522$b$ formed of low threshold (i.e., low Vt) devices, third inverter 522$c$, and NOR logic gate 522$d$ coupled together as shown. In some embodiments, the input terminals of inverters 522$a$ and 522$b$ are coupled to charging node VCONT. In some embodiments, the output "O1" of inverter 522$a$ is received at the input of inverter 522$c$. In some embodiments, the output "O2" of inverter 522$b$ is received at the input of NOR gate 522$d$. In some embodiments, the output of inverter 522$c$ is coupled to an input of NOR gate 522$d$.

In some embodiments, the difference in thresholds of inverter 532$a$ and 522$b$ determine the width of the output PULSE. In some embodiments, by adding more inverters in series to inverter 522$c$, the pulse width of the PULSE signal can be adjusted. In some embodiment, the pulse width of the PULSE signal is programmable by digitally adding or subtracting delays to and from the output "O1." The circuit elements in FIG. 5B form a single PPG module and a chain of this module using self-gating becomes a PPG network, in accordance with some embodiments.

Figure 5C:
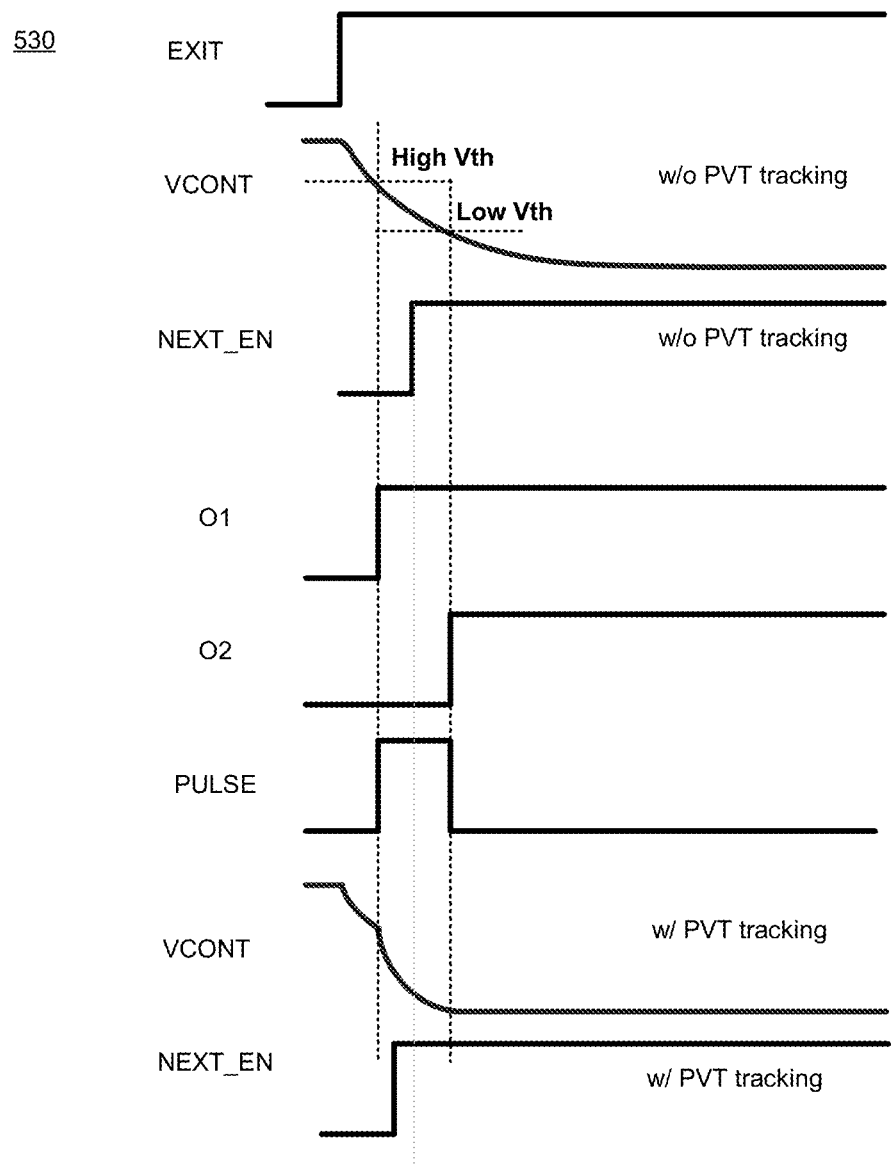
FIG. 5C illustrates a set of waveforms showing an operation of the RC discharging wake-up network of FIG. 5A, in accordance with some embodiments of the disclosure.

FIG. 5C illustrates set 530 of waveforms showing operation of the RC discharging wake-up network of FIG. 5B, in accordance with some embodiments of the disclosure. It is pointed out that those elements of FIG. 5C having the same reference numbers (or names) as the elements of any other figure can operate or function in any manner similar to that described, but are not limited to such.

If there is no slope detection circuit, the NEXT_EN signal is generated when the VCONT signal falls across the Vth (i.e., threshold voltage) of first inverter 522$a$. When applying a PVT tracking option, a pulse is generated from pulse generator 522 and the width of the pulse high state is proportional to the total decaying time, in accordance with some embodiments. During this high state, the additional discharging path from the transistor MN2 and resistor R2 is used with the original path and this quickens the overall discharging speed of charge on node VCONT.

Hence, the NEXT_EN signal can be generated prior to the case without PVT tracking option, in accordance with some embodiments. In some embodiments, the NEXT_EN signal can also be delayed when both of the discharging paths (e.g., paths through resistor R2 and resistor R1) are initially turned on together and then one path is turned off when the pulse becomes high.

Figure 5D:
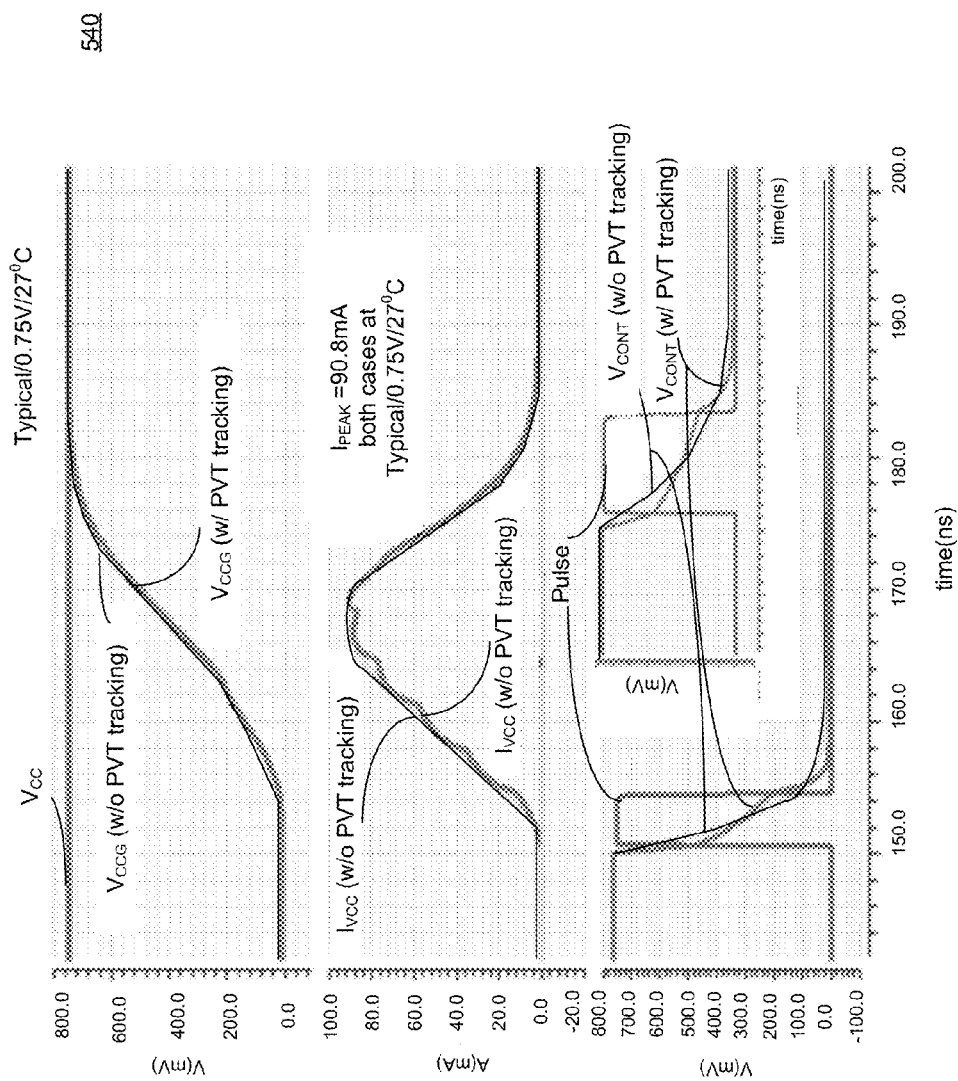
FIGS. 5D-E illustrate a set of simulation waveforms of the circuit level implementation of FIG. 5B, in accordance with some embodiments of the disclosure.
Figure 5E:
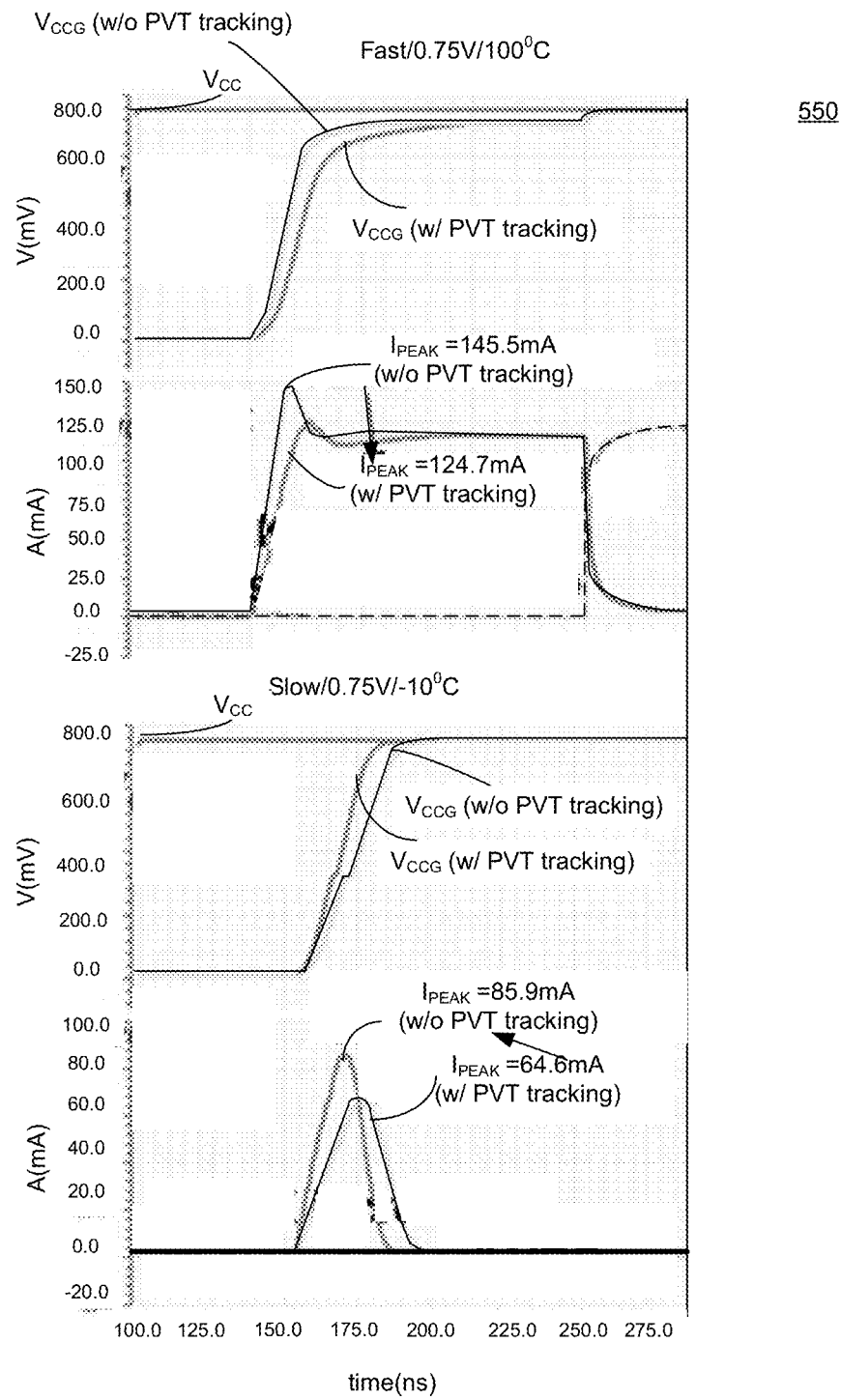

FIGS. 5D-E illustrate sets 540 and 550 of simulation waveforms of the circuit level implementation of FIG. 5B, in accordance with some embodiments of the disclosure. It is pointed out that those elements of FIGS. 5D-E having the same reference numbers (or names) as the elements of any other figure can operate or function in any manner similar to that described, but are not limited to such.

Plot set 540 shows waveforms in a typical process corner at 0.75V $V_{CC}$ and 27° C. temperature. The top plot of set 540 illustrates the wake-up delay times for the PPG stage with PVT tracking (e.g., $501_1$ or 520) and PPG stage 201 without PVT tracking, where the wake-up delay time is measured as the time it takes the $V_{CCG}$ power supply to reach 95% of its high level. The top plot of set 540 also shows the voltage levels of $V_{CC}$ and $V_{CCG}$ over time. The top plot of set 540 shows that the PPG stage with PVT tracking (e.g., $501_1$ or 520) results in slightly longer wake-up delay time compared to PPG stage 201 without PVT tracking.

The plot in the middle of set 540 shows the current peak for PPG stage with PVT tracking (e.g., $501_1$ or 520) and PPG stage 201. The middle plot of set 540 shows that the peak current with PPG stage with PVT tracking (e.g., $501_1$ or 520) is substantially the same as the peak current of PPG stage 201 without PVT tracking. The middle plot of set 540 also shows substantially the same bottom width for PPG stage with PVT tracking (e.g., $501_1$ or 520) and PPG stage 201 without PVT tracking. The area under the two curves is substantially the same, in accordance with some embodiments. In this example, the peak current is 90.8 mA for both cases. The bottom plot of set 540 shows the charging behavior of the charging node VCONT for the PPG stage with PVT tracking (e.g., $501_1$ or 520) and PPG stage 201 without PVT tracking. The bottom plot includes a zoomed version of the same plot.

PVT tracking option makes a big difference for the different PVT conditions as shown by plot set 550. The plot on the top of set 550 illustrates waveforms in a fast process corner at 0.75V $V_{CC}$ and 100° C., while the plot on the bottom of set 550 shows waveforms in the slow process corner at 0.75V $V_{CC}$ at −10° C. With the PVT tracking scheme of various embodiments, the current peak is decreased (e.g., about 15%) from its original di/dt value at a fast process corner and at high temperature. At the slow corner and at low temperature conditions, the current peak is increased for the fast wake-up which may be quite desirable. In some embodiments, PVT tracking ability counteracts with its operating conditions and keeps the PPG wake-up circuit working with little variations, in accordance with some embodiments.

Figure 5F:
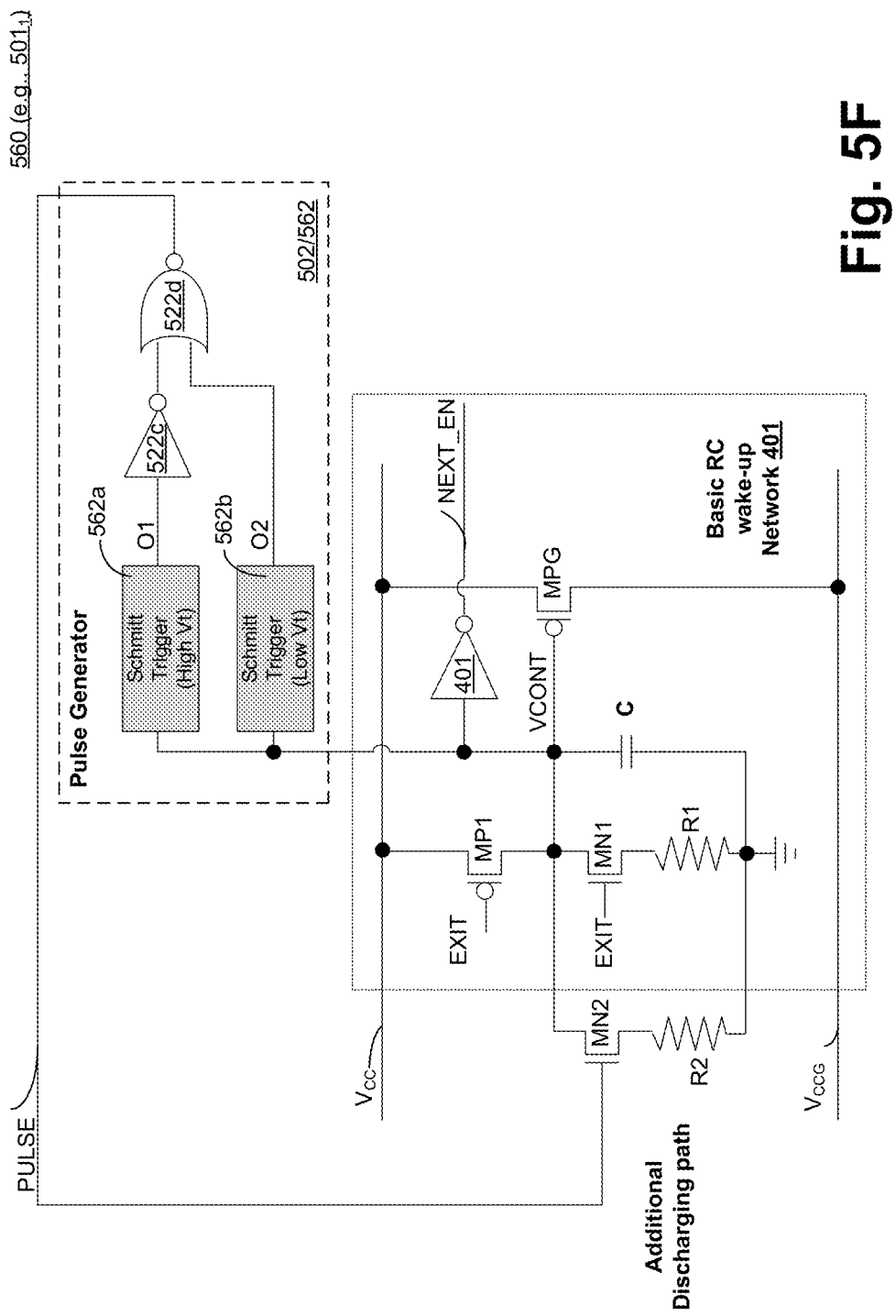
FIG. 5F illustrates a circuit level implementation of the RC discharging wake-up network with self-gating and PVT tracking using a pulse generator implemented with Schmitt Triggers, in accordance with some embodiments of the disclosure.

FIG. 5F illustrates a circuit level implementation 560 (e.g., $501_1$) of the RC discharging wake-up network with self-gating and PVT tracking using a pulse generator implemented with Schmitt Triggers, in accordance with some embodiments of the disclosure. It is pointed out that those elements of FIG. 5F having the same reference numbers (or names) as the elements of any other figure can operate or function in any manner similar to that described, but are not limited to such.

In some embodiments, pulse generator 562 is provided which uses Schmitt Trigger devices. In some embodiments, instead of two inverters with high Vth and low Vth (e.g., 522a and 522b, respectively), two Schmitt triggers (e.g., 562a and 562b) are used. In some embodiments, Schmitt trigger 562a has high Vth devices while Schmitt trigger 562b has low Vth devices. In some embodiments, Schmitt trigger devices are biased so that they behave similar to high Vth and low Vth inverters of pulse generator 522. Operation wise, pulse generator 562 is similar to pulse generator 522, in accordance with some embodiments.

Figure 6A:
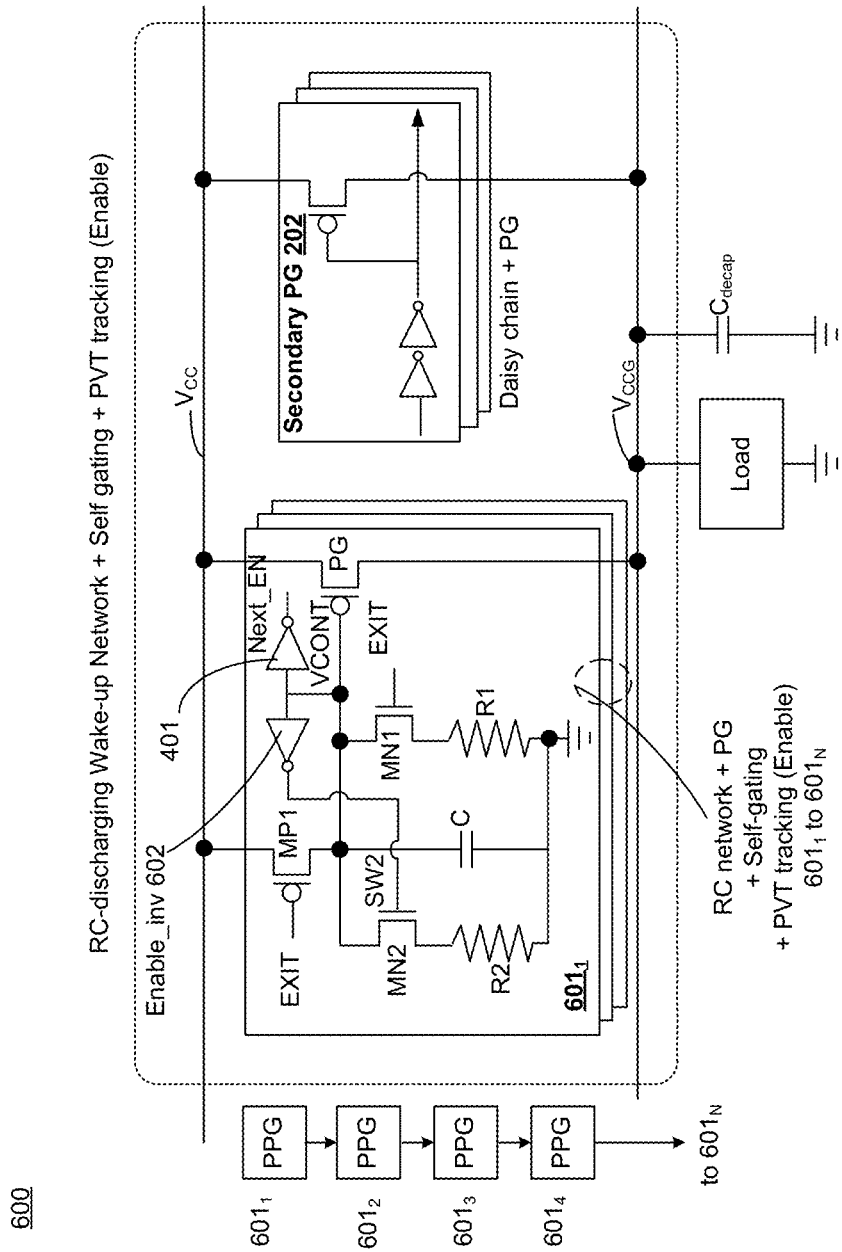
FIG. 6A illustrates an RC discharging wake-up network in a serial topology with self-gating and PVT tracking using an inverter, in accordance with some embodiments of the disclosure.

FIG. 6A illustrates an RC discharging wake-up network 600 in a serial topology with self-gating and PVT tracking using an inverter, in accordance with some embodiments of the disclosure. It is pointed out that those elements of FIG. 6A having the same reference numbers (or names) as the elements of any other figure can operate or function in any manner similar to that described, but are not limited to such.

Compared to PPG stage $501_1$, here pulse generator 502 is replaced with an inverter 602 (also referred to as Enable_inv), according to some embodiments. In some embodiments, inverter 602 enables (e.g., turns on transistor MN2) when the charge on the VCONT node discharges below the threshold voltage of inverter 602. In some embodiments, instead of turning on transistor-resistor MN2-R2 signal path for a short pulse duration, the Enable_inv inverter 602 permanently turns on the MN2-R2 discharge path. As such, the issue of pulse-width narrowing across various PVT conditions is reduced, in accordance with some embodiments.

In some embodiments, each PPG stage is coupled together in a chain such that the NEXT_EN signal (same as Next Exit signal) generated from inverter 401 is received as input at the gates of transistors MN1 and MP1 of the next PPG stage. As such, a serial chain is formed as shown on the left side of FIG. 6A, in accordance with some embodiments. In this chain, PPG stage $601_1$ enables PPG stage $601_2$, PPG stage $601_2$ enables PPG stage $601_3$, PPG stage $601_3$ enables PPG stage $601_4$, and so on.

Figure 6B:
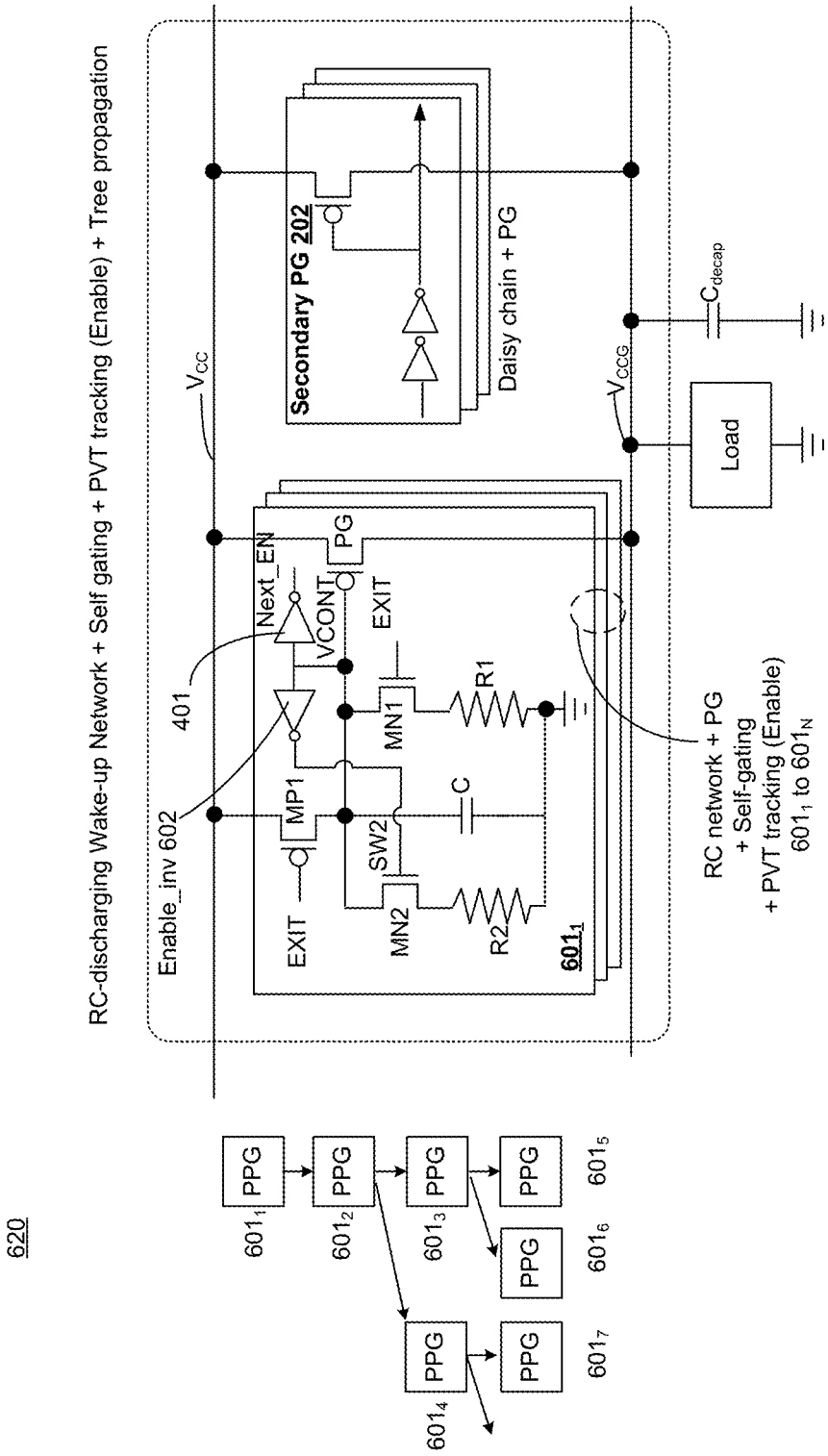
FIG. 6B illustrates an RC discharging wake-up network in a tree formation topology with self-gating and PVT tracking using an inverter, in accordance with some embodiments of the disclosure.

FIG. 6B illustrates an RC discharging wake-up network 620 in a tree formation topology with self-gating and PVT tracking using an inverter, in accordance with some embodiments of the disclosure. It is pointed out that those elements of FIG. 6B having the same reference numbers (or names) as the elements of any other figure can operate or function in any manner similar to that described, but are not limited to such.

Compared to the embodiment of FIG. 6A, here the PPG stages are coupled together in a tree like fashion. For example, PPG stage $601_1$ drives PPG stage $601_2$, PPG stage $601_2$ drives PPG stages $601_3$ and $601_4$. PPG stage $601_3$ drives PPG stages $601_5$ and $601_6$, PPG stage $601_4$ drives PPG stages $601_7$ and $601_8$ (not shown), and so on. In some embodiments, a tree configuration reduces the $V_{CCG}$ wake-up time when di/dt is not significant at slow process corner condition. The embodiments are not limited to a tree configuration. For example, any serial/tree/parallel combination of PPG enable can be realized without exceeding a target di/dt peak.

Figure 7:
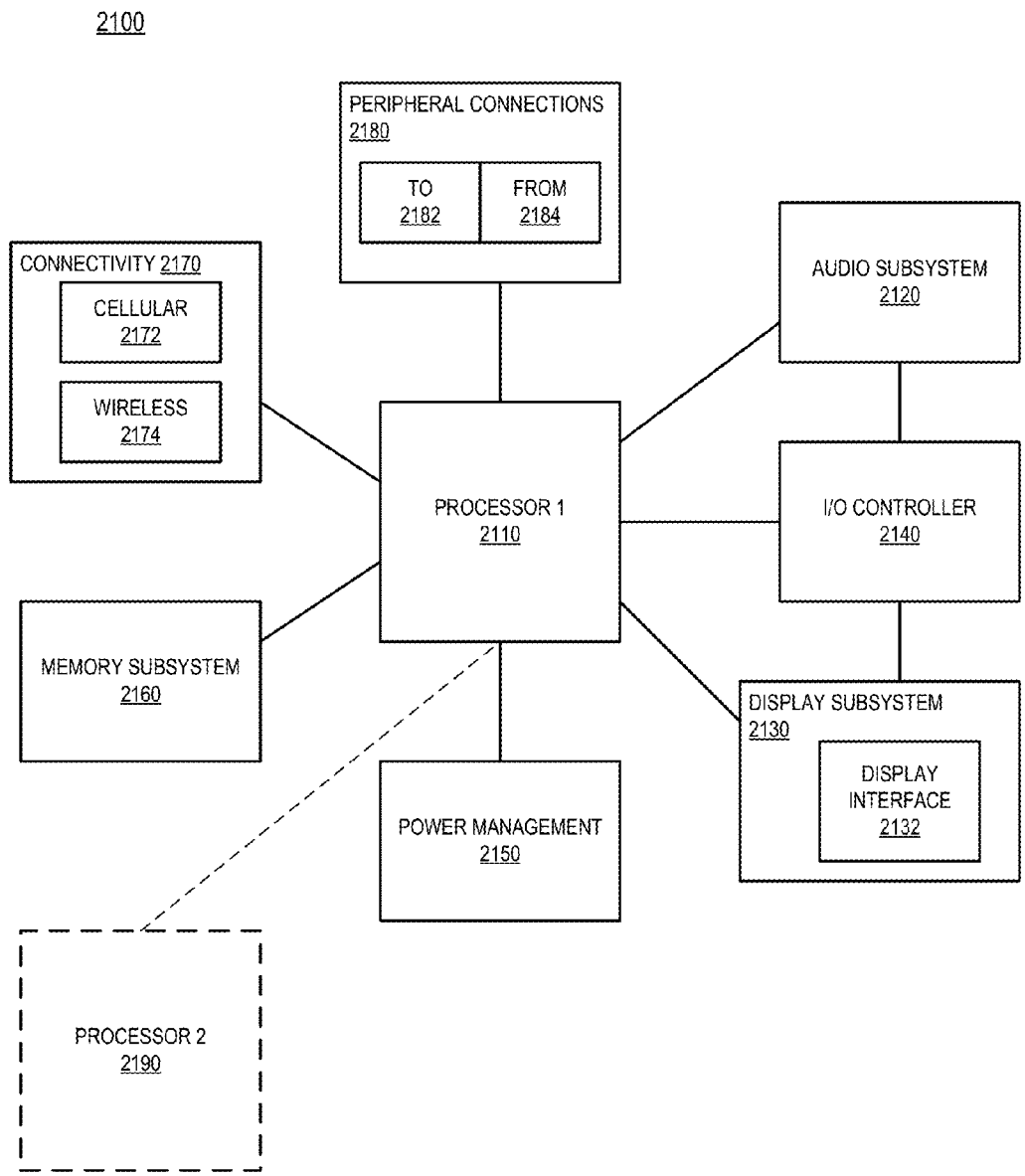
FIG. 7 illustrates a smart device or a computer system or a SoC (System-on-Chip) having an RC discharging wake-up network, in accordance with some embodiments.

FIG. 7 illustrates a smart device or a computer system or a SoC (System-on-Chip) 2100 having an RC discharging wake-up network, in accordance with some embodiments. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 having an RC discharging wake-up network, according to some embodiments discussed. Other blocks of the computing device 2100 may also include an RC discharging wake-up network of some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a power gate transistor coupled to an ungated power supply node and a gated power supply node, the power gate transistor having a gate terminal; a resistive device; a first transistor coupled in series with the resistive device and together forming a pair, the first transistor also coupled to the gate terminal of the power gate transistor; a capacitive device coupled in parallel to the series coupled pair of the first transistor and resistive device; and a second transistor coupled to the gate terminal of the power gate transistor and the ungated power supply node.

In some embodiments, the second transistor is operable to charge the gate terminal of the power gate transistor during a low power mode. In some embodiments, the first transistor is operable to discharge the gate terminal of the power gate transistor when the low power mode is exited. In some embodiments, the power gate is a p-type transistor, wherein the first transistor is an n-type transistor, and wherein the second transistor is a p-type transistor.

In some embodiments, the first and second transistors are controllable by a low power mode exit signal. In some embodiments, the power gate transistor is a primary power gate which is coupled in parallel to a secondary power gate, and wherein the secondary power gate is larger in size than the primary power gate. In some embodiments, the secondary power gate is operable to turn on after the primary power gate is to turn on. In some embodiments, the apparatus comprises an inverter having an input coupled to the gate terminal of the power gate and an output to control a first transistor of another power gate control circuitry.

In some embodiments, the apparatus comprises: a second resistor; a third transistor coupled in series with the second resistor, wherein the third transistor is coupled to the gate terminal of the power gate transistor; and a pulse generator having: an input coupled to the gate terminal of the power gate transistor; and an output coupled to a gate terminal of the third transistor transistor. In some embodiments, the apparatus third transistor is an n-type transistor. In some embodiments, the pulse generator comprises a low threshold inverter and a high threshold inverter. In some embodiments, the pulse generator comprises a low threshold Schmitt Trigger and a high threshold Schmitt Trigger. In some embodiments, the apparatus comprises: a second resistor; a third transistor coupled in series with the second resistor, wherein the third transistor is coupled to the gate terminal of the power gate transistor; and an inverter having an input coupled to the gate terminal of the power gate and an output coupled to a gate terminal of the third transistor.

In another example, an apparatus is provided which comprises: a first modular primary power gate; and a second modular primary power gate coupled in a sequence with the first modular primary power gate, wherein the second modular primary power gate is to turn on after the first modular primary power gate is to turn on, wherein at least one of the first and second modular primary power gates includes: a power gate transistor coupled to an ungated power supply node and a gated power supply node, the power gate transistor having a gate terminal; a resistive device; a first transistor coupled in series with the resistive device together forming a pair, the first transistor also coupled to the gate terminal of the power gate transistor; a capacitive device coupled in parallel to the series coupled pair of the first transistor and resistive device; and a second transistor coupled to the gate terminal of the power gate transistor and the ungated power supply node.

In some embodiments, the apparatus comprises: a third modular primary power gate coupled in a sequence with the second modular primary power gate; and a fourth modular primary power gate coupled in a sequence with the second modular primary power gate, wherein the third and fourth modular primary power gates are to turn on after the second modular primary power gate is to turn on. In some embodiments, at least one of the third and fourth modular primary power gates include: a power gate transistor coupled to an ungated power supply node and a gated power supply node, the power gate transistor having a gate terminal; a resistive device; a first transistor coupled in series with the resistive device and together forming a pair, the first transistor also coupled to the gate terminal of the power gate transistor; a capacitive device coupled in parallel to the series coupled pair of the first transistor and resistive device; and a second transistor coupled to the gate terminal of the power gate transistor and the ungated power supply node.

In another example, a system is provided which comprises: a memory; a processor coupled to the memory, the processor including an apparatus which includes: a power gate transistor coupled to an ungated power supply node and a gated power supply node, the power gate transistor having a gate terminal; a resistive device; a first transistor coupled in series with the resistive device together forming a pair, the first transistor also coupled to the gate terminal of the power gate transistor; a capacitive device coupled in parallel to the series coupled pair of the first transistor and resistive device; and a second transistor coupled to the gate terminal of the power gate transistor and the ungated power supply node; and a wireless interface for allowing the processor to communicate with another device.

In some embodiments, the second transistor is operable to charge the gate terminal of the power gate transistor during a low power mode. In some embodiments, the first transistor is operable to discharge the gate terminal of the power gate transistor when the low power mode is exited. In some embodiments, the power gate is a p-type transistor, wherein the first transistor is an n-type transistor, and wherein the second transistor is a p-type transistor. In some embodiments, the first and second transistors are controllable by a low power mode exit signal.

In some embodiments, the power gate transistor is a primary power gate which is coupled in parallel to a secondary power gate, and wherein the secondary power gate is larger in size than the primary power gate. In some embodiments, the secondary power gate is operable to turn on after the primary power gate is to turn on. In some embodiments, the processor comprises an inverter having an input coupled to the gate terminal of the power gate and an output to control a first transistor of another power gate control circuitry.

In some embodiments, the processor comprises: a second resistor; a third transistor coupled in series with the second resistor, wherein the third transistor is coupled to the gate terminal of the power gate transistor; and a pulse generator having: an input coupled to the gate terminal of the power gate transistor; and an output coupled to a gate terminal of the third transistor. In some embodiments, the third transistor is an n-type transistor. In some embodiments, the pulse generator comprises a low threshold inverter and a high threshold inverter.

In some embodiments, the pulse generator comprises a low threshold Schmitt Trigger and a high threshold Schmitt Trigger. In some embodiments, the processor comprises: a second resistor; a third transistor coupled in series with the second resistor, wherein the third transistor is coupled to the gate terminal of the power gate transistor; and an inverter having an input coupled to the gate terminal of the power gate and an output coupled to a gate terminal of the third transistor.

In another example, a system is provided which comprises: a memory; a processor coupled to the memory, the processor including an apparatus which includes: a first modular primary power gate; and a second modular primary power gate coupled in a sequence with the first modular primary power gate, wherein the second modular primary power gate is to turn on after the first modular primary power gate is to turn on, wherein at least one of the first and second modular primary power gates includes: a power gate transistor coupled to an ungated power supply node and a gated power supply node, the power gate transistor having a gate terminal; a resistive device; a first transistor coupled in series with the resistive device together forming a pair, the first transistor also coupled to the gate terminal of the power gate transistor; a capacitive device coupled in parallel to the series coupled pair of the first transistor and resistive device; and a second transistor coupled to the gate terminal of the power gate transistor and the ungated power supply node; and a wireless interface for allowing the processor to communicate with another device.

In some embodiments, the processor comprises a third modular primary power gate coupled in a sequence with the second modular primary power gate. In some embodiments, the processor comprises a fourth modular primary power gate coupled in a sequence with the second modular primary power gate, wherein the third and fourth modular primary power gates are to turn on after the second modular primary power gate is to turn on. In some embodiments, at least one of the third and fourth modular primary power gates include: a power gate transistor coupled to an ungated power supply node and a gated power supply node, the power gate transistor having a gate terminal; a resistive device; a first transistor coupled in series with the resistive device and together forming a pair, the first transistor also coupled to the gate terminal of the power gate transistor; a capacitive device coupled in parallel to the series coupled pair of the first transistor and resistive device; and a second transistor coupled to the gate terminal of the power gate transistor and the ungated power supply node.

In another example, a method is provided which comprises: charging a gate terminal of the power gate transistor during a low power mode; and discharging the gate terminal of the power gate transistor when the low power mode is exited, wherein the power gate transistor coupled to an ungated power supply node and a gated power supply node. In some embodiments, charging the gate terminal comprises providing charge stored on a capacitive device, wherein the capacitive device is coupled in parallel to a series coupled pair of a first transistor and a resistive device.

In some embodiments, the first transistor also coupled to the gate terminal of the power gate transistor. In some embodiments, the capacitive device is charged via a second transistor which is coupled to the gate terminal of the power gate transistor and the ungated power supply node. In some embodiments, the method comprises controlling the first and second transistors by a low power mode exit signal.

In another example, an apparatus is provided which comprises: means for charging a gate terminal of the power gate transistor during a low power mode; and means for discharging the gate terminal of the power gate transistor when the low power mode is exited, wherein the power gate transistor coupled to an ungated power supply node and a gated power supply node. In some embodiments, the means for charging the gate terminal comprises means for providing charge stored on a capacitive device, wherein the capacitive device is coupled in parallel to a series coupled pair of a first transistor and a resistive device.

In some embodiments, the first transistor also coupled to the gate terminal of the power gate transistor. In some embodiments, the capacitive device is charged via a second transistor which is coupled to the gate terminal of the power gate transistor and the ungated power supply node. In some embodiments, the apparatus comprises means for controlling the first and second transistors by a low power mode exit signal.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a power gate transistor coupled to an ungated power supply node and a gated power supply node, the power gate transistor having a gate terminal;
   a resistive device;
   a first transistor coupled in series with the resistive device and together forming a pair, the first transistor also connected to the gate terminal of the power gate transistor;
   a capacitive device coupled in parallel to the series coupled pair of the first transistor and resistive device; and
   a second transistor coupled to the gate terminal of the power gate transistor and the ungated power supply node.

2. The apparatus of claim 1, wherein the second transistor is operable to charge the gate terminal of the power gate transistor during a low power mode.

3. The apparatus of claim 2, wherein the first transistor is operable to discharge the gate terminal of the power gate transistor when the low power mode is exited.

4. The apparatus of claim 1, wherein the power gate is a p-type transistor, wherein the first transistor is an n-type transistor, and wherein the second transistor is a p-type transistor.

5. The apparatus of claim 1, wherein the first and second transistors are controllable by a low power mode exit signal.

6. The apparatus of claim 1, wherein the power gate transistor is a primary power gate which is coupled in parallel to a secondary power gate, and wherein the secondary power gate is larger in size than the primary power gate.

7. The apparatus of claim 6, wherein the secondary power gate is operable to turn on after the primary power gate is to turn on.

8. The apparatus of claim 1 further comprising an inverter having an input coupled to the gate terminal of the power gate transistor and an output to control a first transistor of a power gate control circuitry.

9. The apparatus of claim 1 comprises:
   a second resistor;
   a third transistor coupled in series with the second resistor, wherein the third transistor is coupled to the gate terminal of the power gate transistor; and
   a pulse generator having:
      an input coupled to the gate terminal of the power gate transistor; and
      an output coupled to a gate terminal of the third transistor.

10. The apparatus of claim 9, wherein third transistor is an n-type transistor.

11. The apparatus of claim 9, wherein the pulse generator comprises a low threshold inverter and a high threshold inverter.

12. The apparatus of claim 9, wherein the pulse generator comprises a low threshold Schmitt Trigger and a high threshold Schmitt Trigger.

13. The apparatus of claim 1 comprises:
   a second resistor;
   a third transistor coupled in series with the second resistor, wherein the third transistor is coupled to the gate terminal of the power gate transistor; and
   an inverter having an input coupled to the gate terminal of the power gate and an output coupled to a gate terminal of the third transistor.

14. An apparatus comprising:
   a first modular primary power gate; and
   a second modular primary power gate coupled in a sequence with the first modular primary power gate, wherein the second modular primary power gate is to turn on after the first modular primary power gate is to turn on, wherein at least one of the first and second modular primary power gates includes:
      a power gate transistor coupled to an ungated power supply node and a gated power supply node, the power gate transistor having a gate terminal;
      a resistive device;
      a first transistor coupled in series with the resistive device together forming a pair, the first transistor also connected to the gate terminal of the power gate transistor;
      a capacitive device coupled in parallel to the series coupled pair of the first transistor and resistive device; and
      a second transistor coupled to the gate terminal of the power gate transistor and the ungated power supply node.

15. The apparatus of claim 14 comprises:
   a third modular primary power gate coupled in a sequence with the second modular primary power gate; and
   a fourth modular primary power gate coupled in a sequence with the second modular primary power gate, wherein the third and fourth modular primary power gates are to turn on after the second modular primary power gate is to turn on.

16. The apparatus of claim 14, wherein at least one of the third and fourth modular primary power gates include:
   a power gate transistor coupled to an ungated power supply node and a gated power supply node, the power gate transistor having a gate terminal;
   a resistive device;
   a first transistor coupled in series with the resistive device and together forming a pair, the first transistor also coupled to the gate terminal of the power gate transistor;

a capacitive device coupled in parallel to the series coupled pair of the first transistor and resistive device; and a second transistor coupled to the gate terminal of the power gate transistor and the ungated power supply node.

17. A system comprising:

a memory;

a processor coupled to the memory, the processor including an apparatus which includes:

a power gate transistor coupled to an ungated power supply node and a gated power supply node, the power gate transistor having a gate terminal;

a resistive device;

a first transistor coupled in series with the resistive device together forming a pair, the first transistor also connected to the gate terminal of the power gate transistor;

a capacitive device coupled in parallel to the series coupled pair of the first transistor and resistive device; and a second transistor coupled to the gate terminal of the power gate transistor and the ungated power supply node; and a wireless interface for allowing the processor to communicate with another device.

18. The system of claim 17, wherein the second transistor is operable to charge the gate terminal of the power gate transistor during a low power mode.

19. The system of claim 18, wherein the first transistor is operable to discharge the gate terminal of the power gate transistor when the low power mode is exited.

20. The system of claim 17, wherein the power gate transistor is a p-type transistor, wherein the first transistor is an n-type transistor, and wherein the second transistor is a p-type transistor.

* * * * *